United States Patent
Lee et al.

(10) Patent No.: US 10,892,171 B2
(45) Date of Patent: Jan. 12, 2021

(54) REMOVAL APPARATUS FOR REMOVING RESIDUAL GAS AND SUBSTRATE TREATING FACILITY INCLUDING THE SAME

(71) Applicants: Samsung Electronics Co., Ltd., Suwon-si (KR); CYMECHS Inc., Hwaseong-si (KR)

(72) Inventors: Heokjae Lee, Suwon-si (KR); Hahn Park, Seoul (KR); Jae Boo Kim, Seongnam-si (KR); Dongil Yoon, Anyang-si (KR); MinYoung Hwang, Suwon-si (KR); Se Un Park, Hwaseong-si (KR); Kang-Min Park, Hwaseong-si (KR); Yongjoon Hong, Yongin-si (KR); Sung Baek Kim, Hwaseong-si (KR); Woo Jin Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 399 days.

(21) Appl. No.: 15/859,480

(22) Filed: Dec. 30, 2017

(65) Prior Publication Data
US 2018/0247836 A1     Aug. 30, 2018

(30) Foreign Application Priority Data
Feb. 24, 2017    (KR) .................. 10-2017-0024955

(51) Int. Cl.
*B08B 7/00*      (2006.01)
*H01L 21/67*    (2006.01)
*H01L 21/677*   (2006.01)

(52) U.S. Cl.
CPC ...... *H01L 21/67034* (2013.01); *B08B 7/0071* (2013.01); *H01L 21/67017* (2013.01);
(Continued)

(58) Field of Classification Search
CPC ............ B08B 7/0071; H01L 21/67017; H01L 21/67034; H01L 21/67115;
(Continued)

(56) References Cited

U.S. PATENT DOCUMENTS 6,952,889 B2    10/2005   Yoo
7,846,845 B2    12/2010   Bahng et al.
(Continued)

FOREIGN PATENT DOCUMENTS

| KR | 19980040780 A | 8/1998 |
| KR | 20080091804 A | 10/2008 |
| KR | 20160045637 A | 4/2016 |

*Primary Examiner* — Levon J Shahinian
(74) *Attorney, Agent, or Firm* — Renaissance IP Law Group LLP

(57) ABSTRACT

A removal apparatus for removing residual gases and a substrate treating facility for removing residual gases is disclosed. The residual gas removal apparatus includes a housing, a gas supply for providing a non-reactive gas into the housing, a supporting member provided to support a substrate and positioned in the housing, a heat radiating member spaced apart from the supporting member and positioned in the housing, and a heating unit for providing heat toward the supporting member and positioned between the heat radiating member and the supporting member.

13 Claims, 17 Drawing Sheets

(52) U.S. Cl.
CPC .... *H01L 21/6719* (2013.01); *H01L 21/67115*
(2013.01); *H01L 21/67167* (2013.01); ***H01L
21/67201* (2013.01); *H01L 21/67248***
(2013.01); *H01L 21/67748* (2013.01); ***H01L
21/67778*** (2013.01)

(58) Field of Classification Search
CPC ........... H01L 21/67167; H01L 21/6719; H01L
21/67201; H01L 21/67248; H01L
21/67748; H01L 21/67778
USPC .................................. 134/1.3, 21, 57 R, 902
See application file for complete search history.

(56) References Cited

U.S. PATENT DOCUMENTS

| | | |
|---|---|---|
| 8,486,194 B2 | 7/2013 | Bhang et al. |
| 2004/0083621 A1 | 5/2004 | Yoo |
| 2007/0163143 A1 | 7/2007 | Mast |
| 2008/0099040 A1 | 5/2008 | Bahng et al. |
| 2013/0040080 A1 | 2/2013 | Bhang et al. |
| 2015/0380278 A1 | 12/2015 | Landis et al. |

# REMOVAL APPARATUS FOR REMOVING RESIDUAL GAS AND SUBSTRATE TREATING FACILITY INCLUDING THE SAME

CROSS-REFERENCE TO RELATED APPLICATIONS

This application claims priority under 35 U.S.C § 119 of Korean Patent Application No. 10-2017-0024955 filed on Feb. 24, 2017 disclosure of which is hereby incorporated by reference herein in its entirety. Embodiments of the present invention relate to a removal apparatus for removing a residual gas and a substrate treating facility including the same.

TECHNICAL FIELD

Many kinds of process gases and solutions are used in fields such as semiconductor processing to treat substrates. For example, when a deposition process is performed in a process chamber at a vacuum state, a deposition gas is provided to deposit a thin-film on a surface of a substrate. When an etching process is performed in a process chamber at a vacuum state, an etching gas is provided to selectively remove a portion of the thin-film deposited on the surface of the substrate. Various residual gases may remain on the surface of the substrate that has experienced a substrate treating process. The residual gases may damage the substrate. Thus, removing residual gases may be required.

SUMMARY

According to an exemplary embodiment of the present inventive concept, a removal apparatus for removing a residual gas may comprise: a housing; a gas supply providing a non-reactive gas into the housing; a supporting member provided to support a substrate in the housing; a heat radiating member spaced apart from the supporting member in the housing; and a heating unit providing heat toward the supporting member and positioned between the heat radiating member and the supporting member.

According to an exemplary embodiment of the present inventive concept, a substrate treating facility may comprise: at least one process treating module; a load lock chamber spaced apart from the process treating module; a transfer chamber connecting the process treating module to a side of the load lock chamber; a substrate transfer module connected to an opposite side of the load lock chamber; and at least one residual gas removal apparatus connected to the substrate transfer module. The substrate transfer module may comprise a substrate transfer unit that transfers a substrate between the load lock chamber and the residual gas removal apparatus. The residual gas removal apparatus may comprise: a housing; a gas supply providing a non-reactive gas into the housing; a supporting member provided to support the substrate in the housing; a heat radiating member spaced apart from the supporting member in the housing; and a heating unit providing heat toward the supporting member and positioned between the heat radiating member and the supporting member.

According to an exemplary embodiment of the present inventive concept, a removal apparatus for removing a residual gas may comprise a housing defining an inner space; a supporting member configured to support a substrate within the inner space; a gas supply channel configured to provide a gas supplied from a gas supply external to the housing into the inner space; a heating unit configured to provide heat toward the supporting member and the gas supply channel; and an exhausting member connected to the housing.

Details of other exemplary embodiments are included in the description and drawings. The present inventive concept is not limited to the above-mentioned exemplary embodiments, other exemplary embodiments which have not been mentioned above will be clearly understood to those skilled in the art from the following description.

It should be noted that these figures are intended to illustrate the general characteristics of methods, structure and/or materials utilized in an exemplary embodiment and to supplement the written description provided below. These drawings are not to scale and may not precisely reflect the precise structural or performance characteristics of any given embodiment, and should not be interpreted as defining or limiting the range of values or properties encompassed by a given exemplary embodiment. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the present inventive concept will be described in detail hereinafter with reference to the accompanying drawings.

Figure 1:
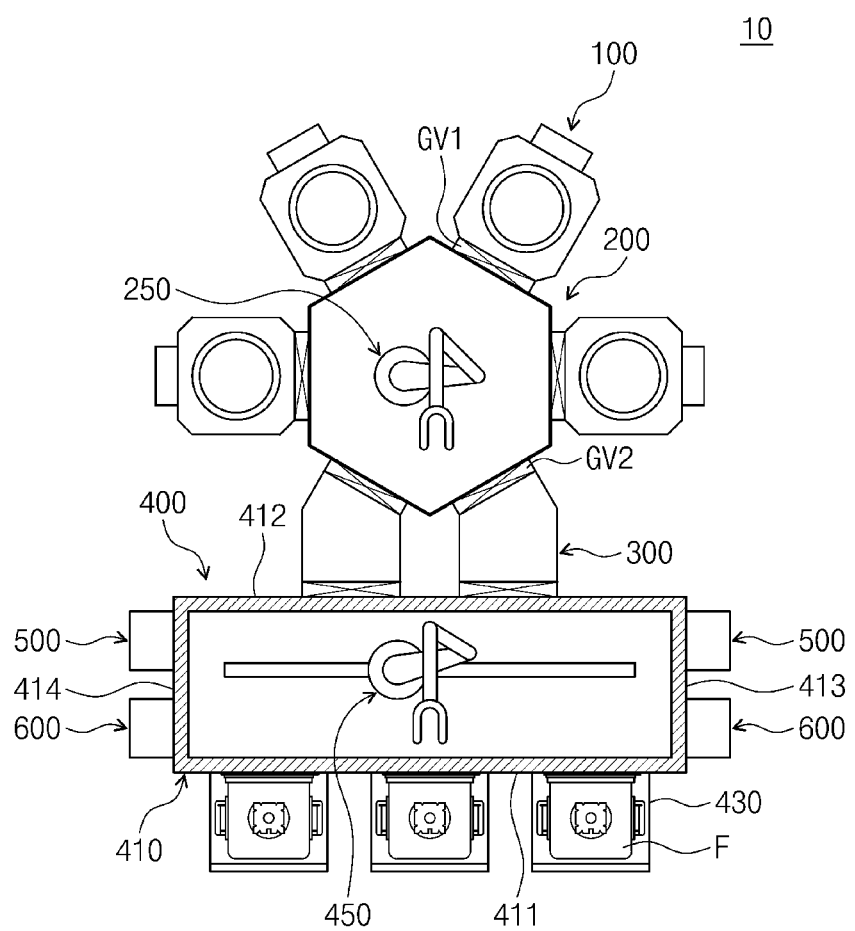
FIGS. 1 and 2 are schematic views illustrating a substrate treating facility, according to an exemplary embodiment of the present inventive concept.
Figure 2:
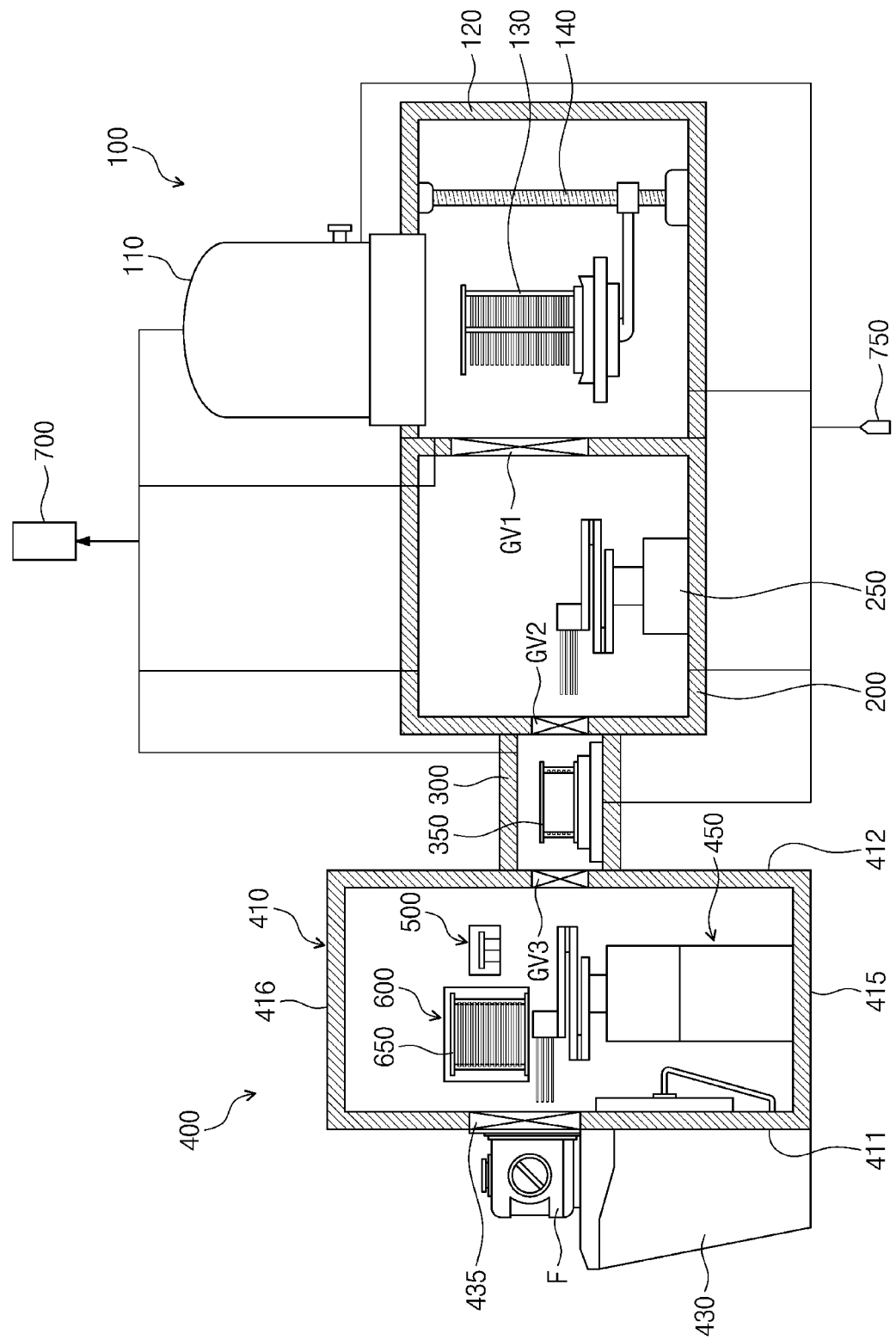

FIGS. 1 and 2 are schematic views illustrating a substrate treating facility according to an exemplary embodiment of the present inventive concept. FIG. 1 is a schematic plan view illustrating a substrate treating facility. FIG. 2 is a schematic cross-sectional view illustrating a substrate treating facility.

Referring to FIGS. 1 and 2, a substrate treating facility 10, according to an exemplary embodiment of the present inventive concept, may include a plurality of process treating modules 100, a transfer chamber 200, a load lock chamber 300, a substrate transfer module 400, and a residual gas removal apparatus 500. The substrate treating facility 10 may further include a substrate reservoir 600, a gas supply 750 (referred to hereinafter as a first gas supply), and a negative pressure supply 700.

Each of the process treating modules 100 may be employed to perform various processes such as etching and deposition. In an exemplary embodiment, each of the process treating modules 100 may be configured to perform a process, such as an etching process, on a plurality of substrates at the same time. Alternatively, in another exemplary embodiment, each of the process treating modules 100 may be configured to perform a process, such as an etching process, on a plurality of substrates one at a time. Each of the process treating modules 100 may include a process chamber 110, a substrate loading member 130, an elevation unit 140 (referred to hereinafter as a first elevation unit), and a treating module chamber 120. The process treating modules 100 may be connected to the transfer chamber 200. For example, the process treating modules 100 may be arranged along a perimeter of the transfer chamber 200. The process treating modules 100 may be spaced apart from each other.

The process chamber 110 may have an inner space. The process chamber 110 may include components for treating a substrate. For example, the process chamber 110 may include a heater assembly (not shown) and a process gas supply (not shown). The process gas supply may provide a process gas to substrates loaded on the substrate loading member 130 in the process chamber 110. The heater assembly may control a temperature at which a substrate is processed.

The substrate loading member 130 may accommodate at least one substrate. For example, the substrate loading member 130 may accommodate approximately 25 to 50 substrates. The substrate loading member 130 may have one or more slots, into each of which a substrate can be inserted. The substrate loading member 130 may be, for example, a boat.

The first elevation unit 140 may be positioned within the treating module chamber 120. The first elevation unit 140 may load and unload the substrate loading member 130 into and out of the process chamber 110. For example, the first elevation unit 140 may drive the substrate loading member 130 toward either the treating module chamber 120 and the process chamber 110, or toward both.

The treating module chamber 120 may be positioned underneath the process chamber 110. The treating module chamber 120 may be connected to the process chamber 110 and the transfer chamber 200. For example, the treating module chamber 120 may be positioned between the process chamber 110 and the transfer chamber 200. The treating module chamber 120 may be connected through a first gate valve GV1 to the transfer chamber 200. The treating module chamber 120 may be connected through an exhaust line (not designated by a reference numeral) to the negative pressure supply 700.

The transfer chamber 200 may be positioned between the process treating module 100 and the load lock chamber 300. The transfer chamber 200 may connect the process treating module 100 to a side of the load lock chamber 300. For example, the transfer chamber 200 may be connected through the first gate valve GV1 to the treating module chamber 120 and may also be connected through a second gate valve GV2 to the load lock chamber 300.

The transfer chamber 200 may have therein a substrate transfer unit 250 (referred to hereinafter as a first substrate transfer unit) for transferring a substrate. The first substrate transfer unit 250 may transfer a substrate between the load lock chamber 300 and the substrate loading member 130 installed within the treating module chamber 120. The first substrate transfer unit 250 may include an end effector capable of transferring, for example, one to five substrates. The first substrate transfer unit 250 may be a robot capable of transferring a substrate at a vacuum state.

The load lock chamber 300 may be positioned between the transfer chamber 200 and the substrate transfer module 400. The load lock chamber 300 may have a side that is connected through the second gate valve GV2 to the transfer chamber 200 and an opposite side that is connected through a third gate valve GV3 to the substrate transfer module 400. In an exemplary embodiment, the transfer chamber 200 and the substrate transfer module 400 may be provided with two load lock chambers 300 therebetween, but the number of the load lock chambers 300 is not limited thereto. The load lock chamber 300 may have therein a loading container 350 in which a substrate is loaded. The load lock chamber 300 may act as a buffer space between two or more different environments. For example, an interior of the load lock chamber 300 may be changed between an atmospheric pressure state and a vacuum pressure state.

The negative pressure supply 700 may be connected through an exhaust line to each of the load lock chamber 300, the transfer chamber 200, the treating module chamber 120, and the process chamber 110. In this configuration, a negative pressure may be provided to each of the load lock chamber 300, the transfer chamber 200, the treating module chamber 120, and the process chamber 110. In an exemplary embodiment, the negative pressure may be a pressure less than atmospheric pressure. For example, the negative pressure may be a vacuum pressure. Hence, a vacuum state may be produced in each of the load lock chamber 300, the transfer chamber 200, the treating module chamber 120, and the process chamber 110 that are connected to the negative pressure supply 700. The negative pressure supply 700 may include a vacuum pump.

The first gas supply 750 may provide a gas through a first gas supply line to each of the load lock chamber 300, the transfer chamber 200, the treating module chamber 120, and the process chamber 110. Accordingly, a differential pressure may be created between one or more of the load lock chamber 300, the transfer chamber 200, the treating module chamber 120, and the process chamber 110.

The substrate transfer module 400 may be connected through the third gate valve GV3 to an opposite side of the load lock chamber 300. The substrate transfer module 400 may be positioned on a front side of the substrate treating facility 10. The substrate transfer module 400 may be an EFEM (Equipment Front End Module), but the present inventive concept is not limited thereto. The substrate transfer module 400 may include a load port 430 from which a FOUP (Front Opening Unified1 Pod) F is loaded and unloaded, an index chamber 410 having an inner space, and a substrate transfer unit 450 (referred to hereinafter as a second substrate transfer unit) positioned within the index chamber 410.

The second substrate transfer unit 450 may transfer a substrate between ones of the FOUP F, the load lock chamber 300, the substrate reservoir 600, and the residual gas removal apparatus 500. The second substrate transfer unit 450 may be a robot capable of transferring a substrate at atmospheric pressure state.

The index chamber 410 may be positioned between the load port 430 and the load lock chamber 300. The index chamber 410 may be connected through the third gate valve GV3 to the load lock chamber 300. The index chamber 410 may be connected to the FOUP F through an entrance 435 of the load port 430.

In an exemplary embodiment, the index chamber 410 may have an inner space and be approximately provided as a rectangular hexahedral shape. The index chamber 410 may include a bottom panel 415, a top panel 416 opposite to the bottom panel 415, a front panel 411, a rear panel 412, and lateral side panels 413 and 414. The front panel 411 and the rear panel 412 may face each other. One of the lateral side panels 413 and 414 may be connected to side ends of the front and rear panels 411 and 412, and the other of the lateral side panels 413 and 414 may be connected to opposite side ends of the front and rear panels 411 and 412. The load port 430 may be connected to the front panel 411 of the index chamber 410. The opposite side of the load lock chamber 300 may be connected to the rear panel 412 of the index chamber 410.

The substrate reservoir 600 may stack and keep either or both dummy substrates and process treated substrates. The substrate reservoir 600 may include a storage container 650 accommodating either or both dummy substrates and process treated substrates. In an exemplary embodiment, the substrate reservoir 600 may be connected to at least one of the lateral side panels 413 and 414 of the index chamber 410. Each of the lateral side panels 413 and 414 may have an opening (not shown) on its portion corresponding to the substrate reservoir 600. The dummy substrate may be used when a substrate is insufficiently provided in the process treating module 100. Alternatively, in another exemplary embodiment, the substrate reservoir 600 may be provided to another chamber. For example, the substrate reservoir 600 may be installed in either the transfer chamber 200 or the load lock chamber 300, or both the transfer chamber 200 and the load lock chamber 300.

The residual gas removal apparatus 500 may remove a residual gas remaining on a substrate that has been treated in the process treating module 100. In an exemplary embodiment, the residual gas removal apparatus 500 may be connected to the substrate transfer module 400. For example, the residual gas removal apparatus 500 may be connected to at least one of the lateral side panels 413 and 414 of the index chamber 410.

At least one of the lateral side panels 413 and 414 may have an opening (not shown) on its portion corresponding to the residual gas removal apparatus 500. Alternatively, in another exemplary embodiment, the residual gas removal apparatus 500 may be engaged with another substrate treating facility such as a substrate sorting facility. The residual gas removal apparatus 500 will be described in detail below with reference to FIGS. 3 to 7.

Figure 3:
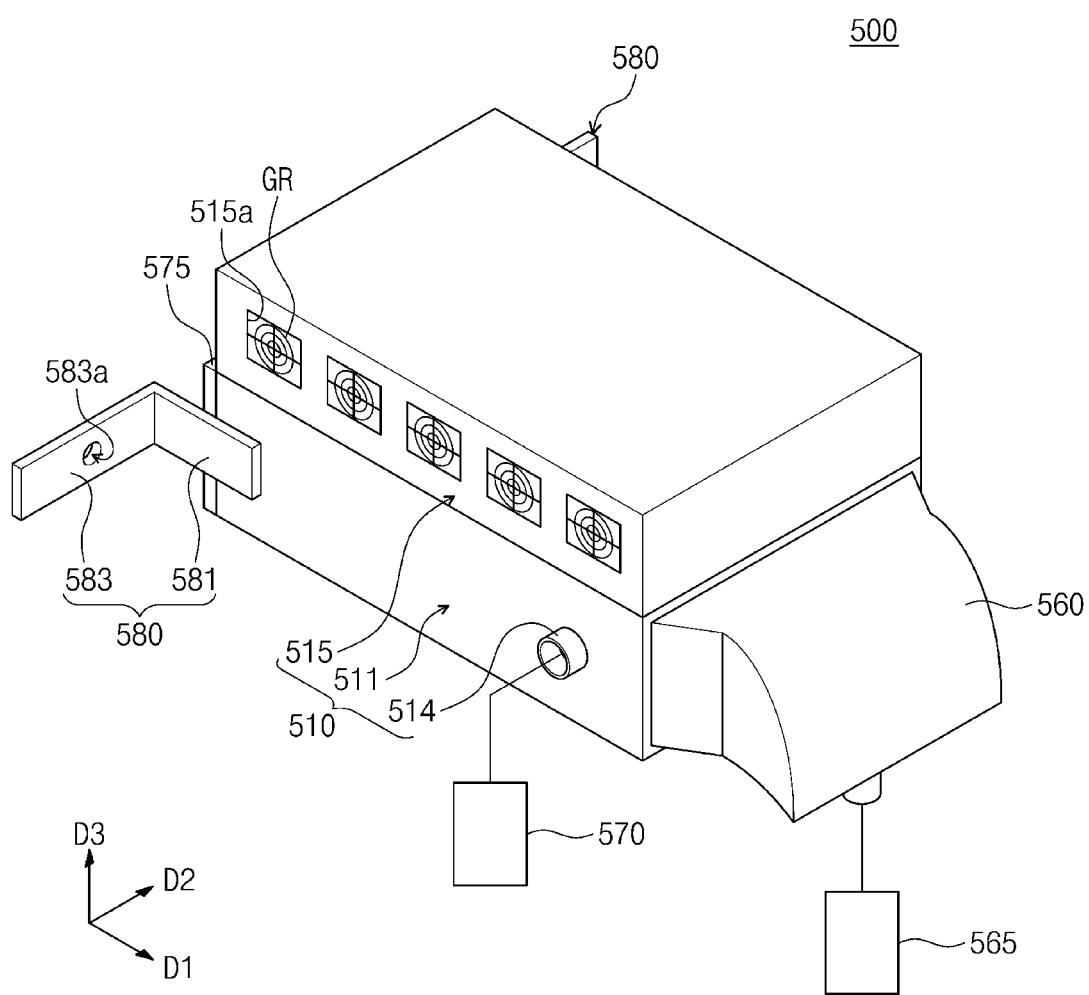
FIG. 3 is a perspective view illustrating a residual gas removal apparatus of FIGS. 1 and 2, according to an exemplary embodiment of the present inventive concept.
Figure 4:
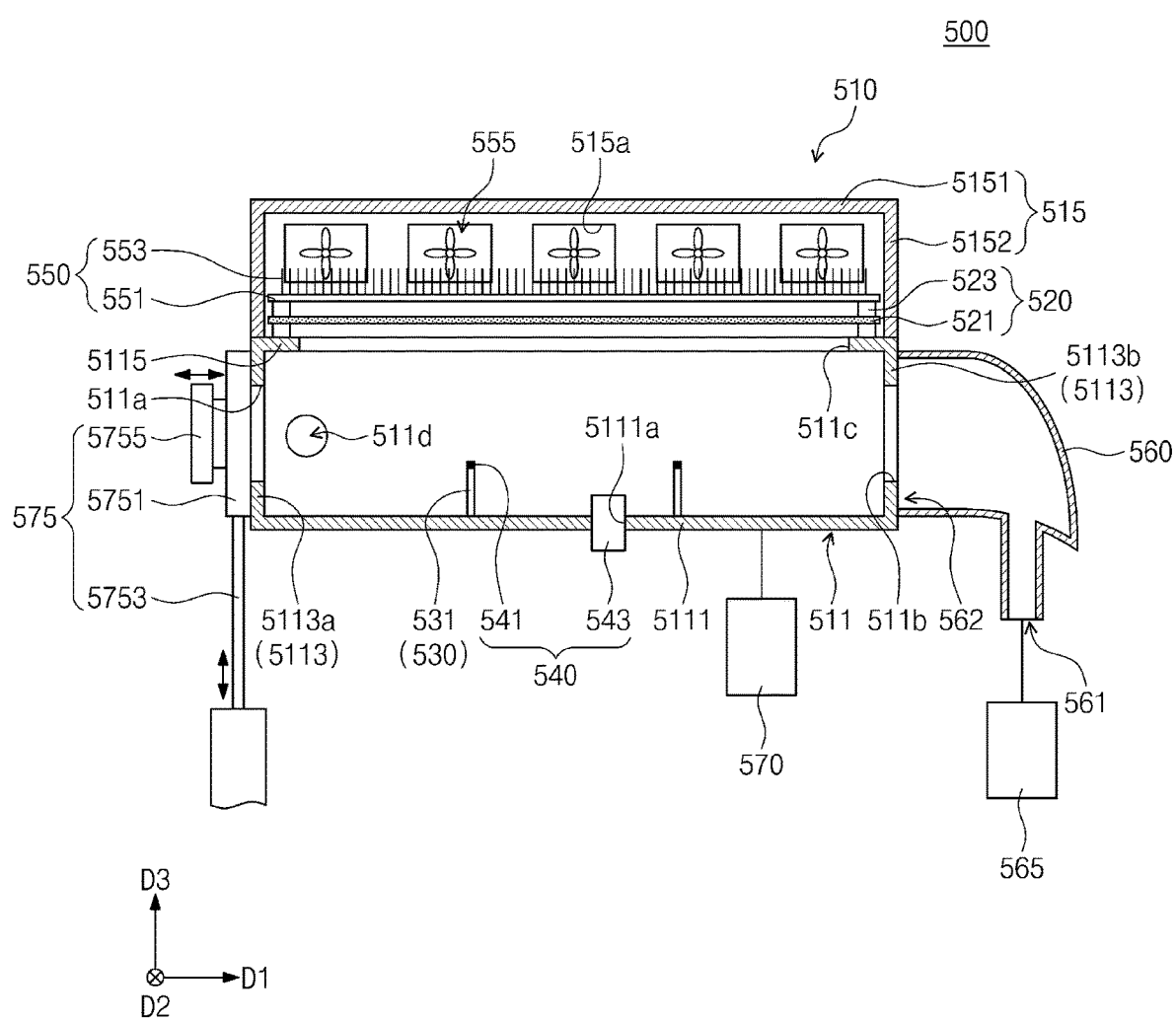
FIG. 4 is a schematic view illustrating the residual gas removal apparatus of FIG. 3, according to an exemplary embodiment of the present inventive concept.
Figure 5:
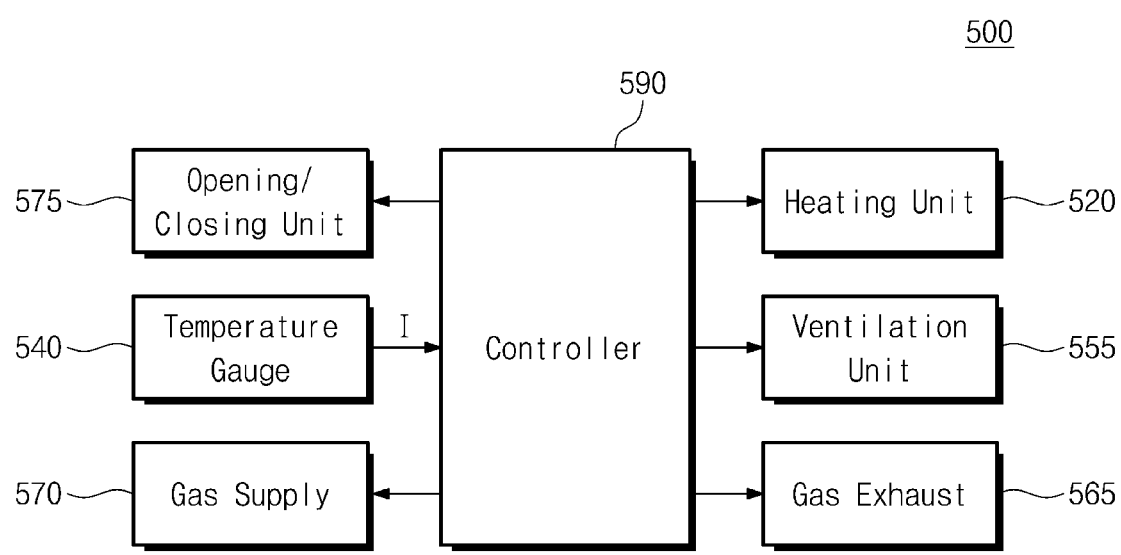
FIG. 5 is a block diagram illustrating a portion of the residual gas removal apparatus of FIG. 3, according to an exemplary embodiment of the present inventive concept.
Figure 6:
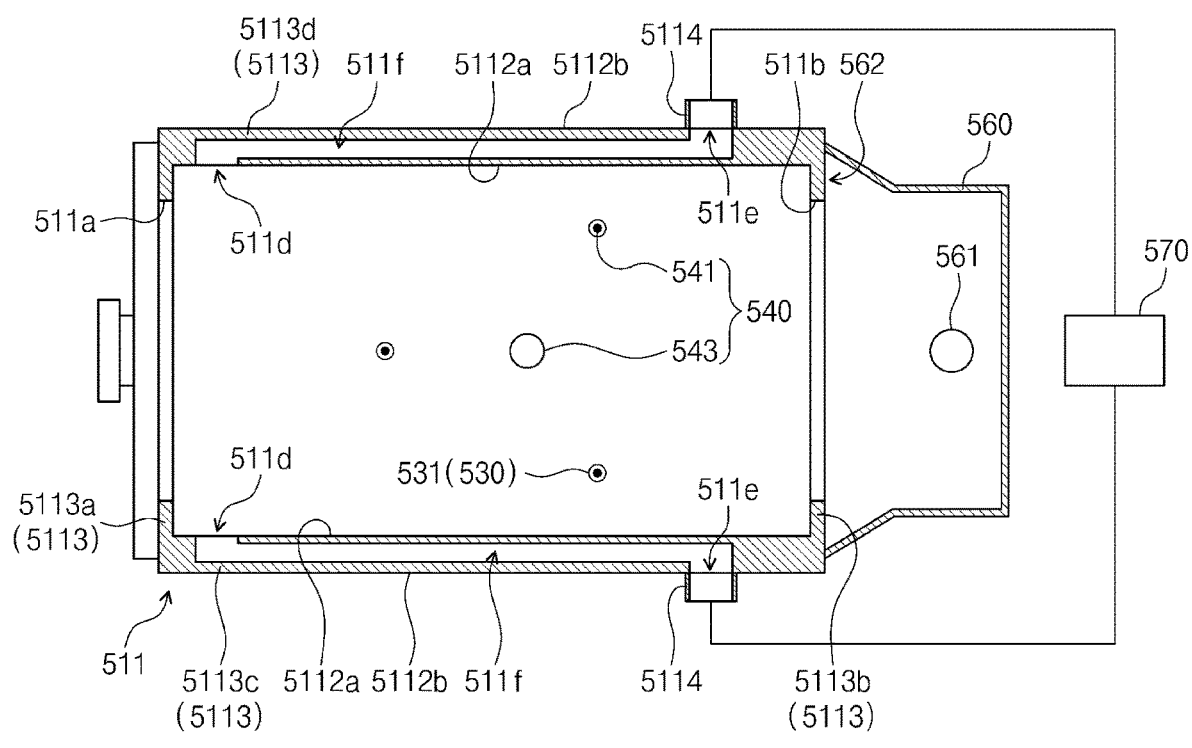
FIG. 6 is a plan view illustrating a portion of the residual gas removal apparatus of FIG. 3, according to an exemplary embodiment of the present inventive concept.

FIG. 3 is a perspective view illustrating the residual gas removal apparatus of FIGS. 1 and 2, according to an exemplary embodiment of the present inventive concept. FIG. 4 is a schematic view illustrating the residual gas removal apparatus of FIG. 3, according to an exemplary embodiment of the present inventive concept. FIG. 5 is a block diagram illustrating a portion of the residual gas removal apparatus of FIG. 3, according to an exemplary embodiment of the present inventive concept. FIG. 6 is a plan view illustrating a portion of the residual gas removal apparatus of FIG. 3, according to an exemplary embodiment of the present inventive concept.

Referring to FIGS. 3 to 6, the residual gas removal apparatus 500 may include a housing 510, a gas supply 570 (referred to hereinafter as a second gas supply), a supporting member 530, a heat radiating member 550, and a heating unit 520. The residual gas removal apparatus 500 may further include a temperature gauge 540, a ventilation unit 555, an opening/closing unit 575, an exhausting member 560, a gas exhaust 565, a combining member 580, and a controller 590.

The housing 510 may have an inner space. The supporting member 530, the heat radiating member 550, the heating unit 520, and the ventilation unit 555 may be positioned in the inner space of the housing 510. In an exemplary embodiment, the inner space of the housing 510 may be at an atmospheric pressure state. A residual gas removal process on a substrate may be performed under an approximately atmospheric pressure state. The housing 510 may include a bottom body 511 and a top body 515 on the bottom body 511.

The bottom body 511 may include a floor section 5111, a first circumferential section 5113 extending toward the top body 515 from a boundary of the floor section 5111, and a flange section 5115 extending inward from the first circumferential section 5113.

The first circumferential section 5113 may have a bottom end connected to the floor section 5111. The first circumferential section 5113 may have a top end connected to the flange section 5115. As shown in FIG. 6, the first circumferential section 5113 may surround the supporting member 530 in a plan view. The first circumferential section 5113 may include a first sidewall 5113a having a first opening 511a therethrough, a second sidewall 5113b facing the first sidewall 5113a, a third sidewall 5113c connecting sides of the first and second sidewalls 5113a and 5113b to each other, and a fourth sidewall 5113d connecting opposite sides of the first and second sidewalls 5113a and 5113b to each other.

The second sidewall 5113b may have a second opening 511b therethrough. The second sidewall 5113b may be spaced apart from the first sidewall 5113a in a first direction D1. The fourth sidewall 5113d may face the third sidewall 5113c. The fourth sidewall 5113d may be spaced apart from the third sidewall 5113c in a second direction D2 perpendicular to the first direction D1. Each of the third and fourth sidewalls 5113c and 5113d may have an inner surface 5112a, an outer surface 5112b, and a gas flow path 511f.

The inner surface 5112a may contact the inner space of the housing 510. The outer surface 5112b may be positioned to face away from the inner surface 5112a and be exposed to outside the housing 510. The outer surface 5112b may have a supply hole 511e connected to the second gas supply 570. The supply hole 511e may be positioned close to the second opening 511b. The inner surface 5112a may have an exhaust hole 511d through which a non-reactive gas is discharged. The exhaust hole 511d may be positioned close to the first opening 511a. The exhaust hole 511d of the third sidewall 5113c may be positioned to face the exhaust hole 511d of the fourth sidewall 5113d. The gas flow path 511f may be positioned between the inner surface 5112a and the outer surface 5112b. In other words, the gas flow path 511f may be positioned within the third and fourth sidewalls 5113c and 5113d. The gas flow path 511f may connect the supply hole 511e to the exhaust hole 511d. In this sense, the supply hole 511e, the exhaust hole 511d and the gas flow path 511f can be characterized as an embodiment of a gas supply channel.

The housing 510 may further include a supply port 514 extending outward from a boundary of the supply hole 511e. The supply port 514 may be provided as a cylindrical shape. The supply port 514 may act as a connector that is connected to a supply line (not designated by a reference numerical) of the second gas supply 570.

The bottom body 511 may have a third opening 511c facing the floor section 5111. The third opening 511c may vertically overlap the floor section 5111. As viewed in plan, the third opening 511c may have a size less than that of the floor section 5111.

The top body 515 may cover the third opening 511c of the bottom body 511. The top body 515 may include a covering section 5151 facing the floor section 5111 and a second circumferential section 5152 extending toward the bottom body 511 from a boundary of the covering section 5151. The second circumferential section 5152 may have a top end connected to the covering section 5151 and a bottom end connected to the bottom body 511. As viewed in plan, the second circumferential section 5152 may surround the heating unit 520, the ventilation unit 555, and the heat radiating member 550. The second circumferential section 5152 may have at least one heat radiating hole 515a therethrough. In an exemplary embodiment, multiple heat radiating holes 515a may be provided. The heat radiating holes 515a may be arranged along the first direction D1. A grill GR may be positioned on the heat radiating hole 515a. Thus, foreign substances may be prevented from being introduced through the heat radiating hole 515a into the housing 510.

According to an exemplary embodiment of the present inventive concept, the top body 515 may be detachably engaged with the bottom body 511. The housing 510 may include a member (not shown) that detachably engages the bottom body 511 and the top body 515 with each other. Alternatively, in another exemplary embodiment, the top body 515 and the bottom body 511 may be integrally formed to constitute a single unitary body.

The supporting member 530 may be positioned within the housing 510. For example, the supporting member 530 may be provided on the floor section 5111. The supporting member 530 may support a substrate positioned within the housing 510. The supporting member 530 may include a plurality of supporters 531. The supporters 531 may be spaced apart from each other. Each of the supporters 531 may extend in a third direction D3 perpendicular to the first and second directions D1 and D2. As viewed in plan, the supporters 531 may be placed on vertices of an imaginary regular triangle.

The heat radiating member 550 may be positioned within the housing 510. The heat radiating member 550 may be spaced apart from the supporting member 530. For example, the heat radiating member 550 may be spaced apart from the supporting member 530 in the third direction D3. The heat radiating member 550 may be spaced apart from the third opening 511c in the third direction D3. The heat radiating member 550 may include a heat radiating plate 551 and a plurality of heat radiating pins 553.

The heat radiating plate 551 may have a first surface (not designated by a reference numeral) and a second surface (not designated by a reference numeral) facing away from each other. The first surface may face the supporting member 530. The first and second surfaces may be flat. The heat radiating pins 553 may be positioned on the second surface. The heat radiating pins 553 may elongate in the third direction D3 from the second surface. Each of the heat radiating pins 553 may be provided as a cylindrical shape, but the present inventive concept is not limited thereto.

The heating unit 520 may be positioned between the heat radiating member 550 and the supporting member 530. The heating unit 520 may produce heat that heats a substrate on the supporting member 530. The heat produced from the heating unit 520 may be provided to a substrate on the supporting member 530. The heat provided to a substrate may promote to exhaust a residual gas on the substrate. For example, the heat provided to a substrate may activate a residual gas on a surface of the substrate. A residual gas may be exhausted from a substrate more efficiently than if no heat is provided to the substrate. It therefore may be possible to enhance removal efficiency of the residual gas on the substrate.

The heating unit 520 may include a fixing member 523 and at least one heating element 521. The heating element 521 may be elongated in the first direction D1. The heating element 521 may be one of a lamp that radiates light toward the supporting member 530 and an electrical heater that emits heat toward the supporting member 530. In an exemplary embodiment, the heating element 521 may be an electrical heater. The heating unit 520 may be connected to an external power source (not shown). The heating unit 520 will be described in detail below with reference to FIG. 7.

The temperature gauge 540 may be provided to measure a temperature of a substrate provided in the housing 510. For example, the temperature gauge 540 may be provided to measure a temperature of a substrate provided on the supporting member 530. The temperature gauge 540 may measure a temperature inside the housing 510 to measure temperature information I. Temperature information I may be transmitted to the controller 590 from the temperature gauge 540. The temperature information I may include information about temperature of either a substrate or of an interior of the housing 510, or both.

The temperature gauge 540 may include either a first temperature gauge unit 541 by which a substrate is measured to determine its temperature in a contacting manner or a second temperature gauge unit 543 by which a substrate is measured to determine its temperature in a non-contacting manner, or both a first temperature gauge unit 541 and a second temperature gauge unit 543. In an exemplary embodiment, the temperature gauge 540 may include either or both the first and second temperature gauge units 541 and 543.

The first temperature gauge unit 541 may be provided on the supporting member 530. The first temperature gauge unit 541 may be positioned between the supporting member 530 and a substrate placed on the supporting member 530. The first temperature gauge unit 541 may measure a temperature of a substrate while being in contact with the substrate. For example, the first temperature gauge unit 541 may be a contact type temperature sensor.

The second temperature gauge unit 543 may be positioned on the housing 510. For example, the second temperature gauge unit 543 may be positioned on the floor section 5111 of the bottom body 511. The second temperature gauge unit 543 may be provided in an insert hole 5111a of the floor section 5111.

The second temperature gauge unit 543 may be spaced apart from a substrate placed on the supporting member 530. For example, the second temperature gauge unit 543 may be positioned below and spaced apart from a substrate placed on the supporting member 530. In this configuration, the second temperature gauge unit 543 may measure a temperature of a substrate while being in non-contact with the substrate. For example, the second temperature gauge unit 543 may be a thermographic camera. The second temperature gauge unit 543 may measure a temperature inside the housing 510. The second temperature gauge unit 543 may be spaced apart from the supporting member 530.

The second gas supply 570 may provide a non-reactive gas into the housing 510. The second gas supply 570 may be positioned outside the housing 510. As discussed above, the second gas supply 570 may be connected to the supply holes 511e of the third and fourth sidewalls 5113c and 5113d. The non-reactive gas may include one of nitrogen ($N_2$) and an inert gas. The inert gas may include one or more noble gases such as argon (Ar), helium (He), or the like or any combination thereof. The non-reactive gas may act as a purge gas. A flow of the non-reactive gas will be described in detail below with reference to FIG. 8.

The ventilation unit 555 may be positioned within the housing 510. The ventilation unit 555 may be positioned close to the heat radiating member 550. In an exemplary embodiment, the ventilation unit 555 may be positioned between the heat radiating member 550 and the second circumferential section 5152 of the top body 515. In an exemplary embodiment, the ventilation unit 555 may include a ventilation fan (not designated by a reference numeral) and a motor (not shown) that rotates the ventilation fan.

When the ventilation fan rotates, a gas may be discharged from inside the housing 510 through the heat radiating holes 515a to outside the housing 510. For example, when the ventilation fan rotates, a gas around the heat radiating pins 533 may be discharged through the heat radiating holes 515a to outside the housing 510. The heat radiating member 550 may then be cooled.

Optionally, multiple ventilation units 555 may be provided. The ventilation units 555 may be arranged along the first direction D1. Each of the ventilation units 555 may overlap the heat radiating hole 515a in a direction parallel to the second direction D2. In an exemplary embodiment, some of the heat radiating pins 553, the ventilation unit 555, and the heat radiating hole 515a may be sequentially arranged along the second direction D2.

The opening/closing unit 575 may open and close the first opening 511a. The opening/closing unit 575 may be positioned within or outside the housing 510. In an exemplary embodiment, the opening/closing unit 575 may be positioned outside the housing 510. The opening/closing unit 575 may include a shield plate 5751, a first driving unit 5753, and a second driving unit 5755.

The shield plate 5751 may be provided to have a size greater than that of the first opening 511a. Therefore, the first and second driving units 5753 and 5755 may drive the shield plate 5751 to completely cover the first opening 511a. The shield plate 5751 may have a shape corresponding to that of the first opening 511a. For example, when the first opening 511a is provided to have an approximately rectangular shape, the shield plate 5751 may be provided as an approximately rectangular shape.

The first driving unit 5753 may drive the shield plate 5751 to move in a direction (referred to hereinafter as an up-down direction) parallel to the third direction D3. In this description, the up-down direction may be a direction extending both forward and rearward in the third direction D3. The first driving unit 5753 may be connected to a bottom or top surface of the shield plate 5751.

The second driving unit 5755 may drive the shield plate 5751 to move in a direction (referred to hereinafter as a front-back direction) parallel to the first direction D1. In this description, the front-back direction may be a direction extending both forward and rearward in the first direction D1. The first driving unit 5753 may be connected to a front or rear surface of the shield plate 5751. The first and second driving units 5753 and 5755 may be a hydraulic or pneumatic cylinder, but the present inventive concept is not limited thereto.

The opening/closing unit 575 may be operated as follows. The first driving unit 5753 may operate such that the shield plate 5751 may move to overlap the first opening 511a in the first direction D1. When the shield plate 5751 overlaps the first opening 511a, the second driving unit 5755 may drive the shield plate 5751 toward the first opening 511a. The shield plate 5751 may thus close the first opening 511a while completely covering the first opening 511a.

The exhausting member 560 may be connected to the housing 510. For example, the exhausting member 560 may be connected to the second sidewall 5113b of the bottom body 511. The exhausting member 560 may have a hollow container shape. The exhausting member 560 may have therein a guide path (not designated by a reference numeral) that guides a flow of gas, an introduction hole 562 connected to the second opening 511b, and an exhaust hole 561 through which a gas is discharged outside.

The introduction hole 562 and the exhaust hole 561 may be spaced apart from each other. The guide path may connect the introduction hole 562 to the exhaust hole 561. The introduction hole 562 may be aligned with the second opening 511b. The introduction hole 562 may have a size greater than that of the second opening 511b, but the present inventive concept is not limited thereto. The exhaust hole 561 may have a size less than that of the introduction hole 562. The guide path may have a cross-section perpendicular to a flow direction of gas, and the cross-section may decrease as approaching the exhaust hole 561 from the introduction hole 562. In this configuration, based on Bernoulli's theorem, a gas entering the introduction hole 562 may flow toward the exhaust hole 561 at high speed. In an exemplary embodiment, the exhaust hole 561 may be provided at a floor section of the exhausting member 560. A gas may thus be discharged downward.

The gas exhaust 565 may exhaust a gas from inside the housing 510 to outside the housing 510. The gas exhaust 565 may be connected to the exhaust hole 561 of the exhausting member 560. The gas exhaust 565 may receive a gas through the exhaust hole 561 from one or both of the housing 510 and the exhausting member 560. A gas in the housing 510 may thus discharge outside the housing 510. The gas exhaust 565 may include a vacuum pump, but the present inventive concept is not limited thereto.

The combining member 580 may combine the housing 510 and the substrate transfer module 400 with each other. A plurality of the combining members 580 may be connected to opposite sides of the housing 510. For example, each of the combining members 580 may be connected to a corresponding one of the third and fourth sidewalls 5113c and 5113d of the bottom body 511.

Each of the combining members 580 may include a first combining plate 581 connected to the housing 510 and a second combining plate 583 connected to the substrate transfer module 400. The first and second combining plates 581 and 583 may be coupled to each other. For example, the first and second combining plates 581 and 583 may be integrally formed to constitute a single unitary body. The first combining plate 581 may be provided parallel to the first direction D1. The second combining plate 583 may be provided parallel to the second direction D2. For example, the second combining plate 583 may be positioned perpendicular to the first combining plate 581. The second combining plate 583 may have a fastening hole 583a into which a fastening member (not shown) is inserted. The second combining plate 583 may be connected through the fastening member (not shown) to the substrate transfer module (see 400 of FIG. 1).

The controller 590 may control operations of the ventilation unit 555, the opening/closing unit 575, the second gas supply 570, and the gas exhaust 565. The controller 590 may acquire temperature information of a substrate from the temperature gauge 540. The controller 590 may control the heating unit 520 by using the temperature information of the substrate.

According to an exemplary embodiment of the present inventive concept, the controller 590 may control an amount of current provided to the heating unit 520 until a substrate temperature reaches a preset first temperature. For example, the controller 590 may reduce an amount of current provided to the heating unit 520 when the substrate temperature is greater than the first temperature. The controller 590 may increase an amount of current provided to the heating unit 520 when the substrate temperature is less than the first temperature. The controller 590 may thus adjust the substrate temperature through control of the heating unit 520. In this description, the first temperature may be a temperature capable of activating a residual gas on a substrate without damaging the substrate. The first temperature may change depending on a kind of substrate, a treating process on the substrate, and so forth. For example, the first temperature may be in the range of about 300° C. to about 500° C., but the present inventive concept is not limited thereto.

According to an exemplary embodiment of the present inventive concept, the controller 590 may control an amount of current provided to the heating unit 520 so as to allow the substrate temperature to exceed a preset second temperature. In this description, the second temperature may be a temperature capable of activating a residual gas on a substrate. For example, the second temperature may be in the range of about 100° C. to about 300° C., but the present inventive concept is not limited thereto. The second temperature may be less than the first temperature.

When the heating unit 520 is repeatedly turned on and off, the life span of the heating unit 520 may be reduce. For example, when an electrical heater is turned on, the electrical heater may elongate its own electrical resistor. The elongated electrical resistor may contract when the electrical heater is turned off. Therefore, the electrical resistor may suffer from damage caused by the on/off operation of the electrical heater. For example, the electrical resistor may break down due to repeated turn-on/off of the electrical heater. In an exemplary embodiment, in order to prevent reduction in life span of the heating unit 520, the controller 590 may control the heating unit 520 not to stop its operation. For example, the controller 590 may drive the heating unit 520 to continue its operation even when no substrate is provided within the housing 510. The damage of the electrical resistor caused by on/off of the electrical heater may be reduced.

Figure 7:
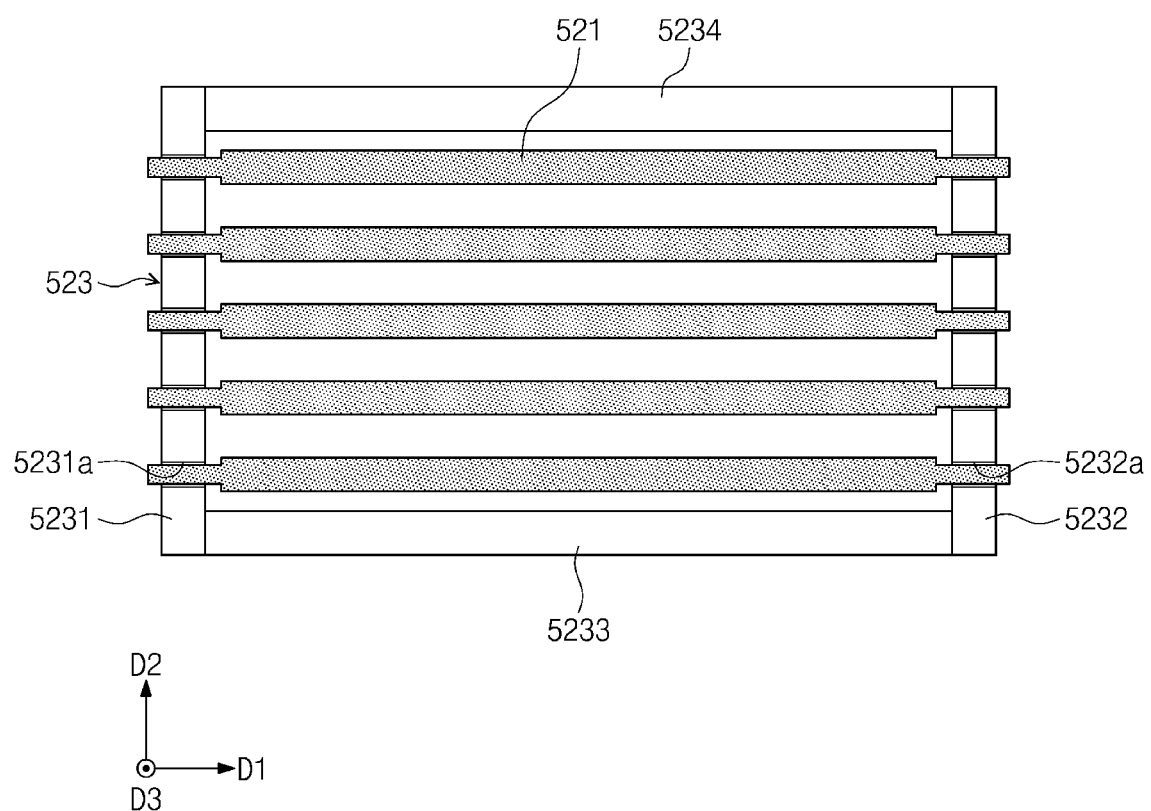
FIG. 7 is a plan view illustrating a heating unit of FIG. 4, according to an exemplary embodiment of the present inventive concept.

FIG. 7 is a plan view illustrating the heating unit of FIG. 4, according to an exemplary embodiment of the present inventive concept. FIG. 4 is a schematic view illustrating an example of the heating unit of the residual gas removal apparatus shown in FIG. 3, according to an exemplary embodiment of the present inventive concept.

Referring to FIGS. 4, 5, and 7, the heating unit 520 may include a fixing member 523 and at least one heating element 521. In an exemplary embodiment, the heating unit 520 may include a plurality of heating elements 521. As shown in FIG. 4, the fixing member 523 may be positioned on the flange section 5115 of the bottom body 511. Alternatively, in another exemplary embodiment, the fixing member 523 may be fixed to the second circumferential section 5152 of the top body 515. The fixing member 523 may have at its central portion a through opening (not designated by a reference numeral) therethrough. The through opening may vertically overlap the third opening 511c. The fixing member 523 may include a first fixing part 5231, a second fixing part 5232, a first connecting part 5233, and a second connecting part 5234. The through opening may be surrounded by the first and second fixing parts 5231 and 5232 and the first and second connecting parts 5233 and 5234.

The first fixing part 5231 may be elongate along the second direction D2. The first fixing part 5231 may have at least one first insert opening 5231a into which an end of the heating element 521 is inserted. The second fixing part 5232 may be spaced apart from the first fixing part 5231 in the first direction D1. The first and second fixing parts 5231 and 5232 may face each other. The second fixing part 5232 may be elongate along the second direction D2. The second fixing part 5232 may have at least one second insert opening 5232a into which an opposite end of the heating element 521 is inserted. The first and second insert openings 5231a and 5232a may be a groove or hole. A plurality of the first and second insert openings 5231a and 5232a may be arranged along the second direction D2. Each of the first and second fixing parts 5231 and 5232 may be provided as a bar shape.

The first connecting part 5233 may connect a side of the first fixing part 5231 to a side of the second fixing part 5232. The first connecting part 5233 may be elongate along the first direction D1. The second connecting part 5234 may connect an opposite side of the first fixing part 5231 to an opposite side of the second fixing part 5232. The first and second connecting parts 5233 and 5234 may face each other. The second connecting part 5234 may be spaced apart from the first connecting part 5233 in the second direction D2. Each of the first and second connecting parts 5233 and 5234 may be provided as a bar shape.

In one embodiment, multiple heating element 521 may be provided. As discussed above, individual heating elements 521 may be an electrical heater having an electrical resistor. The plurality of heating elements 521 may be arranged along the second direction D2. The plurality of heating elements 521 may be electrically connected to an external power source. Accordingly, the plurality of heating elements 521 may convert electrical energy into heat energy.

The heating unit 520 may further include a reflecting member (not shown) between the heat radiating member 550 and the heating element 521. The reflecting member may cause the supporting member 530 to receive a portion of heat transmitted to the heat radiating member 550.

Figure 8:
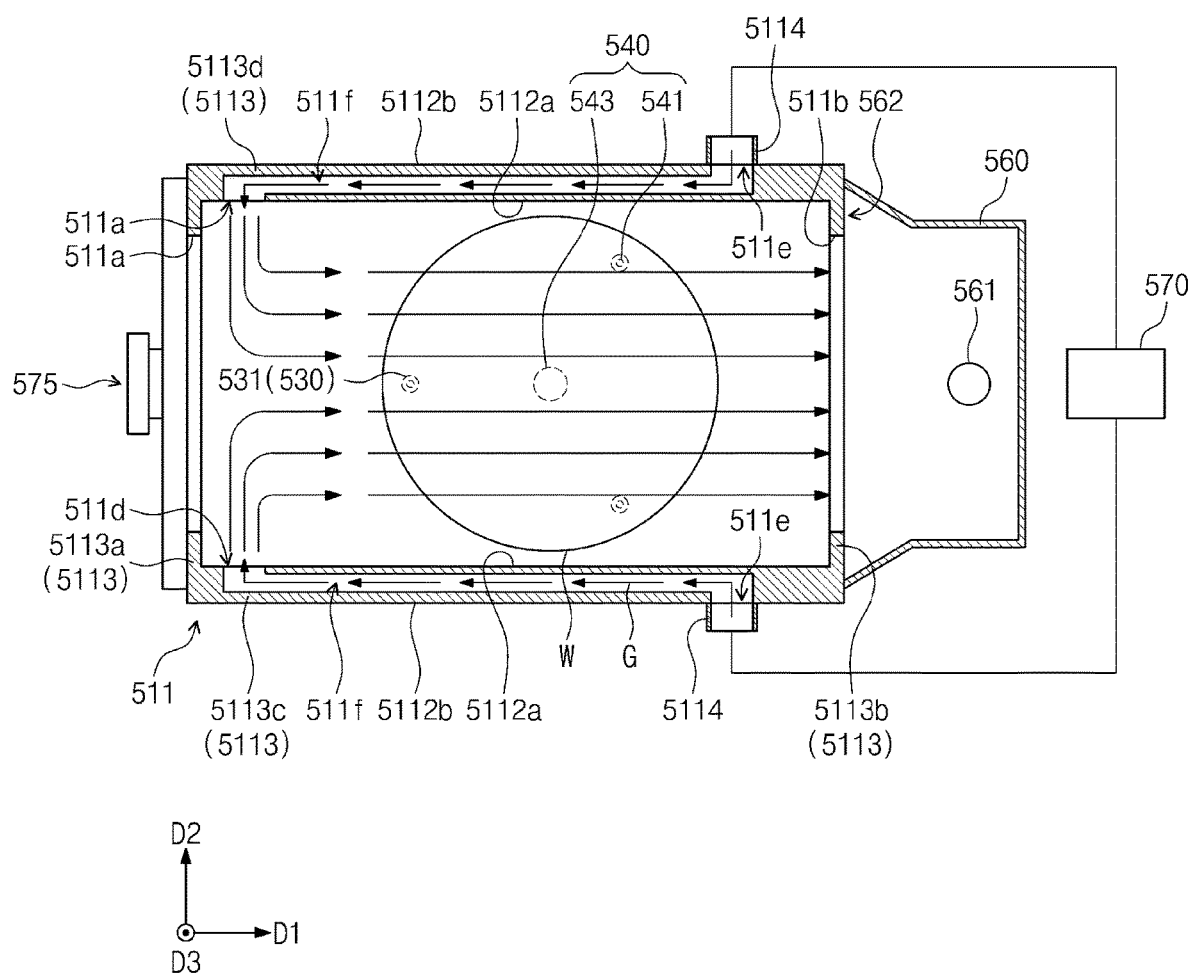
FIG. 8 is a plan view for explaining a state where a non-reactive gas is supplied into a housing from a gas supply of FIG. 7, according to an exemplary embodiment of the present inventive concept.

FIG. 8 is a plan view for explaining a state where a non-reactive gas is supplied into the housing from the gas supply of FIG. 3, according to an exemplary embodiment of the present inventive concept. For convenience of the description, the residual gas removal apparatus is partially illustrated and the elements of FIG. 8 may correspond to FIG. 6.

Referring to FIG. 8, the second gas supply 570 may be connected through a supply line (not designated by a reference numeral) to the supply port 514. A non-reactive gas G may flow from the second gas supply 570 into the supply port 514, the supply hole 511e, the gas flow path 511f, and the exhaust hole 511d in the foregoing sequence. The non-reactive gas G may flow from the supply hole 511e into the exhaust hole 511d. When the non-reactive gas G flows from the supply hole 511e toward the exhaust hole 511d, heat may be provided from the housing 510 through the inner surface 5112a to the non-reactive gas G. The humidity of the non-reactive gas G may then be reduced. The rate of defects caused by humidity of the non-reactive gas G may, thus, be reduced on a substrate W.

The non-reactive gas G (referred to hereinafter as an exhaust gas) discharged from the exhaust hole 511d may flow toward the first opening 511a. For example, the exhaust gas G may flow in a direction parallel to the second direction D2. The exhaust gas G may serve as an air curtain. For example, the exhaust gas G may prevent introduction of an external gas through the first opening 511a.

After the exhaust gas G flows toward the first opening 511a, the gas exhaust 565 may inhale the exhaust gas G to flow toward the substrate W on the supporting member 530. The exhaust gas G may purge a residual gas on the substrate W. That is, the exhaust gas G may remove the residual gas on the substrate W. When the exhaust gas G purges the residual gas, the exhaust gas G and the residual gas may be discharged through the exhaust hole 561 to outside the exhausting member 560.

Figure 9:
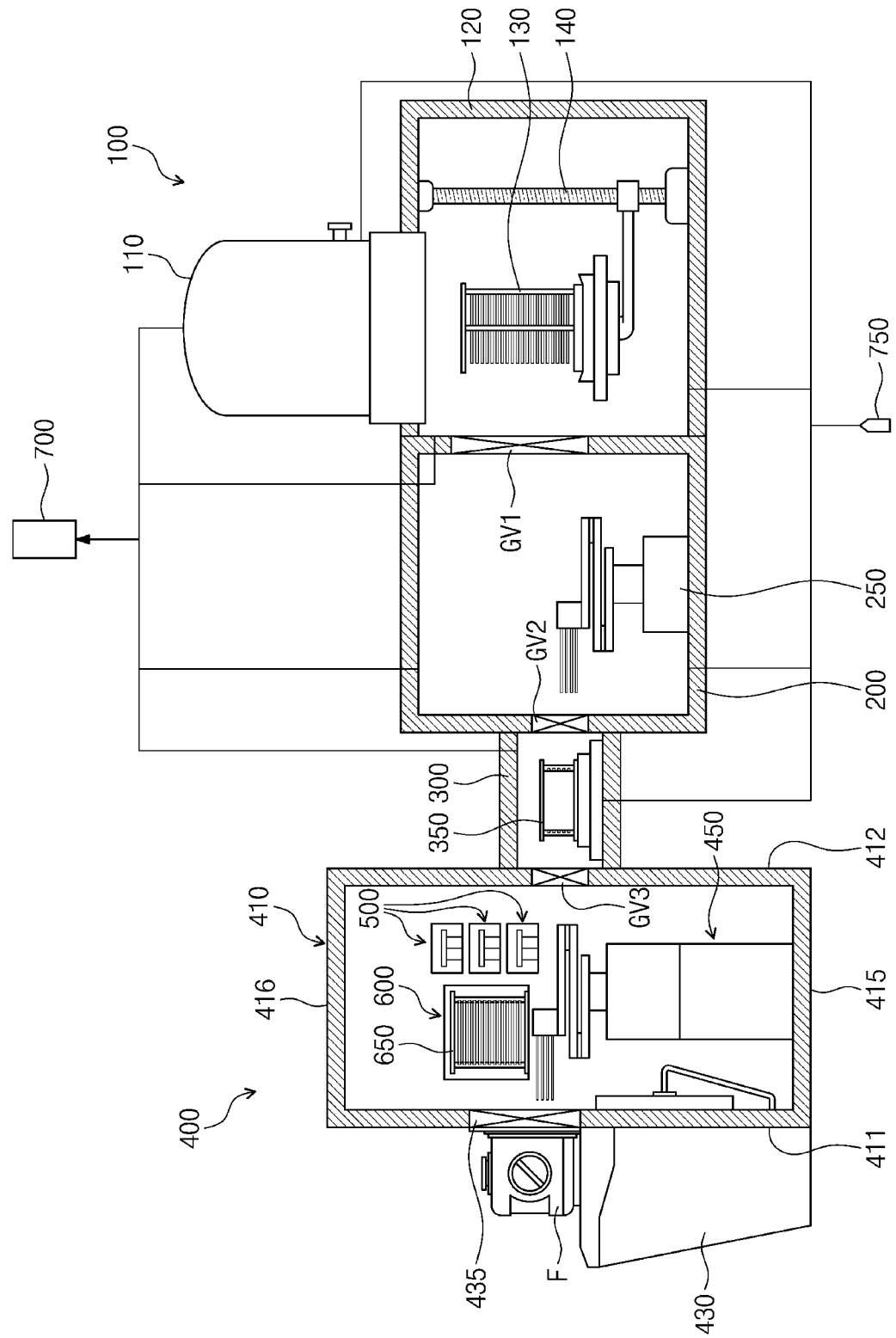
FIG. 9 is a schematic view illustrating other example of the substrate treating facility of FIG. 2, according to an exemplary embodiment of the present inventive concept.

FIG. 9 is a schematic view illustrating other example of the substrate treating facility shown in FIG. 2, according to an exemplary embodiment of the present inventive concept. The components substantially the same as those discussed with reference to FIG. 2 are omitted for brevity of the description. Different from the substrate treating facility 10 shown in FIG. 2, the substrate treating facility 10 shown in FIG. 9 may include a plurality of residual gas removal apparatuses 500. The residual gas removal apparatuses 500 may be connected to at least one of the lateral side panels 413 and 414 of the index chamber 410. In an exemplary embodiment, the residual gas removal apparatuses 500 may be arranged in a direction from the bottom panel 415 toward the top panel 416. Alternatively, in another exemplary embodiment, the residual gas removal apparatuses 500 may be arranged in a direction from the front panel 411 toward the rear panel 412 or arranged in a matrix shape.

Figure 10A:
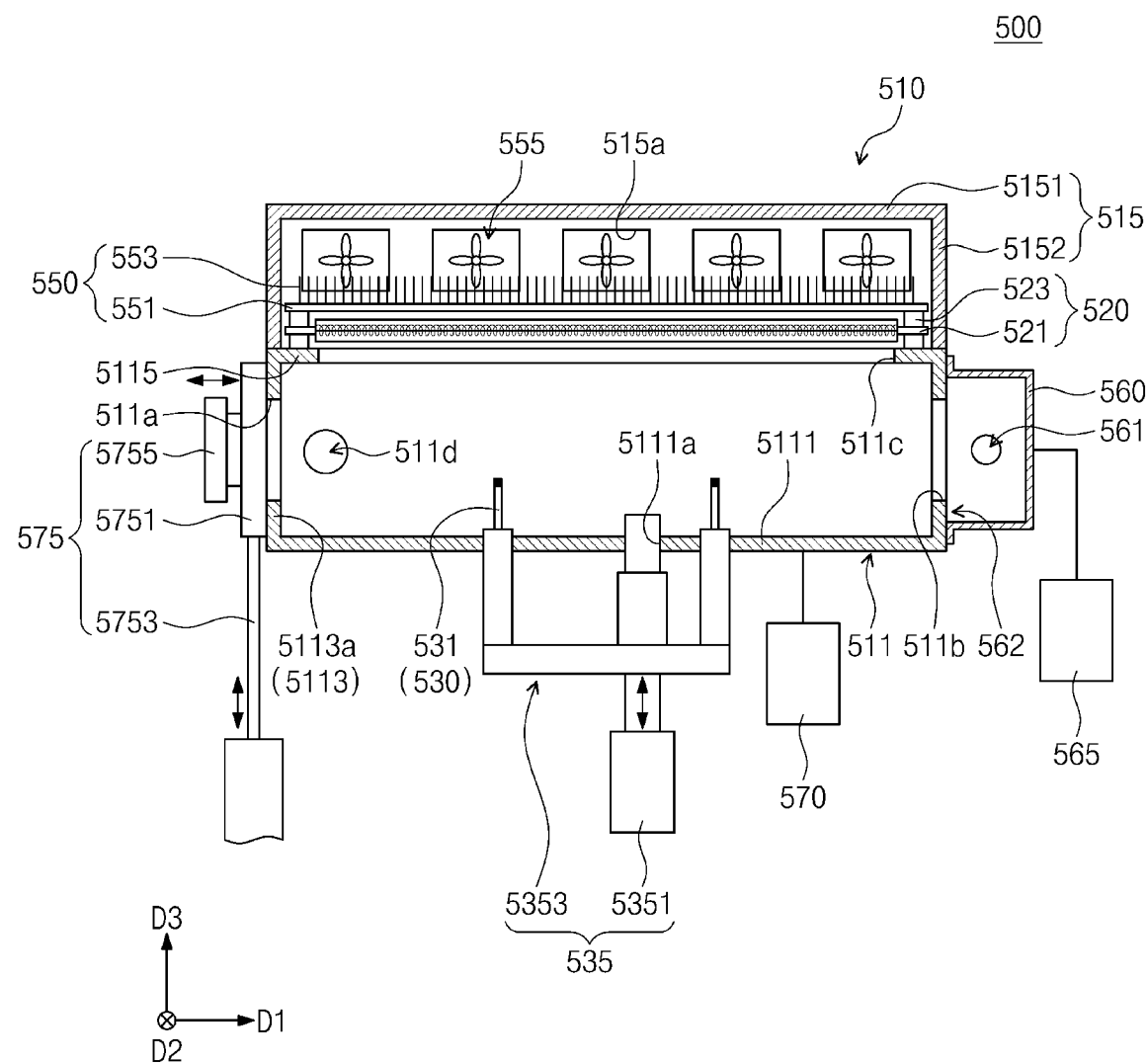
FIG. 10A is a schematic view illustrating other example of the residual gas removal apparatus of FIG. 3, according to an exemplary embodiment of the present inventive concept.
Figure 10B:
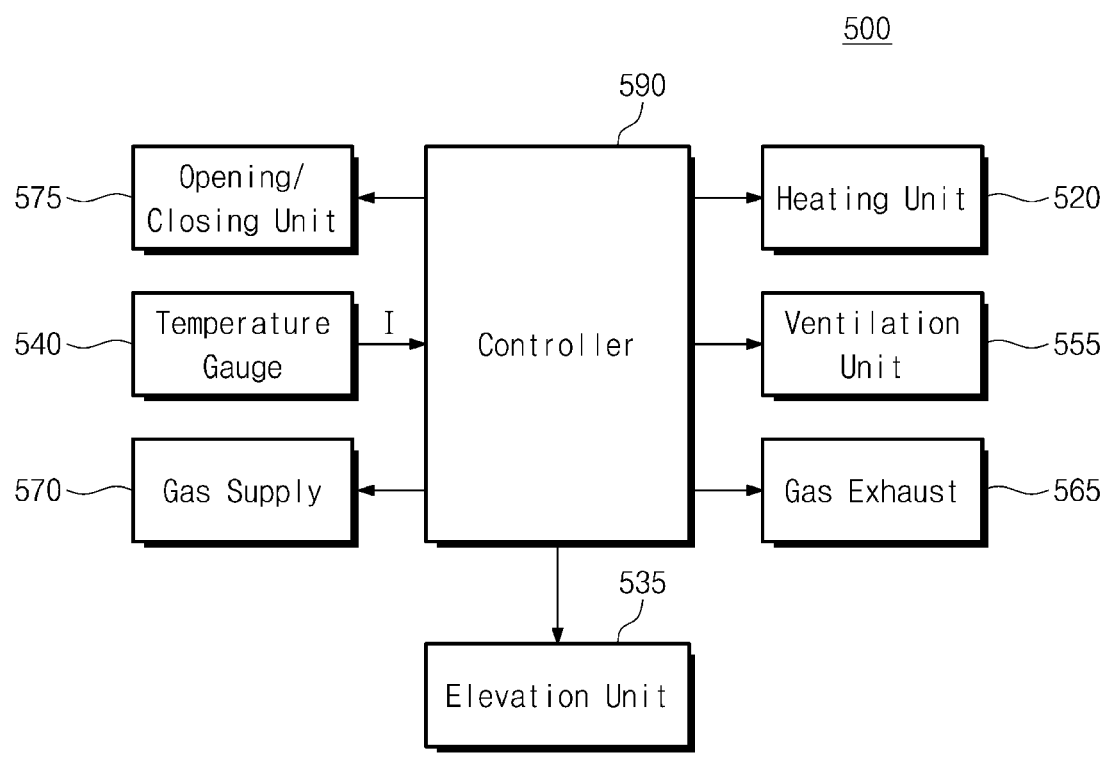
FIG. 10B is a block diagram partially illustrating the residual gas removal apparatus of FIG. 10A, according to an exemplary embodiment of the present inventive concept.

FIG. 10A is a schematic view illustrating other example of the residual gas removal apparatus shown in FIG. 3, according to an exemplary embodiment of the present inventive concept. FIG. 10B is a block diagram illustrating a portion of the residual gas removal apparatus of FIG. 10A, according to an exemplary embodiment of the present inventive concept. In the exemplary embodiment that follows, components substantially the same as those of the embodiments discussed with reference to FIGS. 3 to 5 are omitted or abbreviated for brevity of the description. Different from the residual gas removal apparatus 500 shown in FIG. 3, the residual gas removal apparatus 500 shown in FIGS. 10A, and 10B may further include an elevation unit 535 (referred to hereinafter as a second elevation unit).

The second elevation unit 535 may be connected to either the supporting member 530 and the second temperature gauge unit 543, or may be connected to both the supporting member 530 and the second temperature gauge unit 543. The second elevation unit 535 may be positioned underneath either the supporting member 530 and the second temperature gauge unit 543, or underneath both the supporting member 530 and the second temperature gauge unit 543. The second elevation unit 535 may adjust a distance between the supporting member 530 and the heating unit 520. In other words, the second elevation unit 535 may drive the supporting member 530 toward the heating unit 520. The second elevation unit 535 may drive the supporting member 530 away from the heating unit 520. For example, the second elevation unit 535 may drive the supporting member 530 in a vertical direction. The second elevation unit 535 may adjust a distance between the second temperature gauge unit 543 and the heating unit 520. The second elevation unit 535 may include a connecting member 5353 and an elevation cylinder 5351. The connecting member 5353 may be connected to either or both the supporting member 530 and the second temperature gauge unit 543, and the elevation cylinder 5351 may move the connecting member 5353.

The connecting member 5353 may include a main frame (not designated by a reference numeral) connected the elevation cylinder 5351, a plurality of first connecting frames (not designated by a reference numeral) that connect the main frame to the supporting member 530, and a second connecting frame that connects the main frame (not designated by a reference numeral) to the second temperature gauge unit 543. In an exemplary embodiment, the main frame may be provided as an approximately triangular shape in a plan view. The first and second connecting frames may be provided as bar shape. The first and second connecting frames may be elongate in the third direction D3.

The elevation cylinder 5351 may drive the connecting member 5353 in a vertical direction. The first and second connecting frames may thus move in the vertical direction. The connecting member 5353 may be but not limited to a hydraulic cylinder, a pneumatic cylinder, or the like. The floor section 5111 of the bottom body 511 may have a plurality of holes through which the first connecting frames penetrate.

The controller 590 may control the second elevation unit 535 by using temperature information of a substrate. The controller 590 may control the second elevation unit 535 to adjust the distance between the supporting member 530 and the heating unit 520. The controller 590 may thus adjust the substrate temperature through control of the second elevation unit 535.

For example, in order to increase the substrate temperature, the controller 590 may control the second elevation unit 535 to drive the supporting member 530 toward the heating unit 520. In order to reduce the substrate temperature, the controller 590 may control the second elevation unit 535 to drive the supporting member 530 away from the heating unit 520.

Different from the heating element 521 of the heating unit 520 shown in FIG. 3, the heating element 521 of the heating unit 520 shown in FIG. 10B may be a lamp that radiates light onto the supporting member 530. The exhaust hole 561 of the exhausting member 560 may be formed on a side surface of the exhausting member 560.

Figure 11:
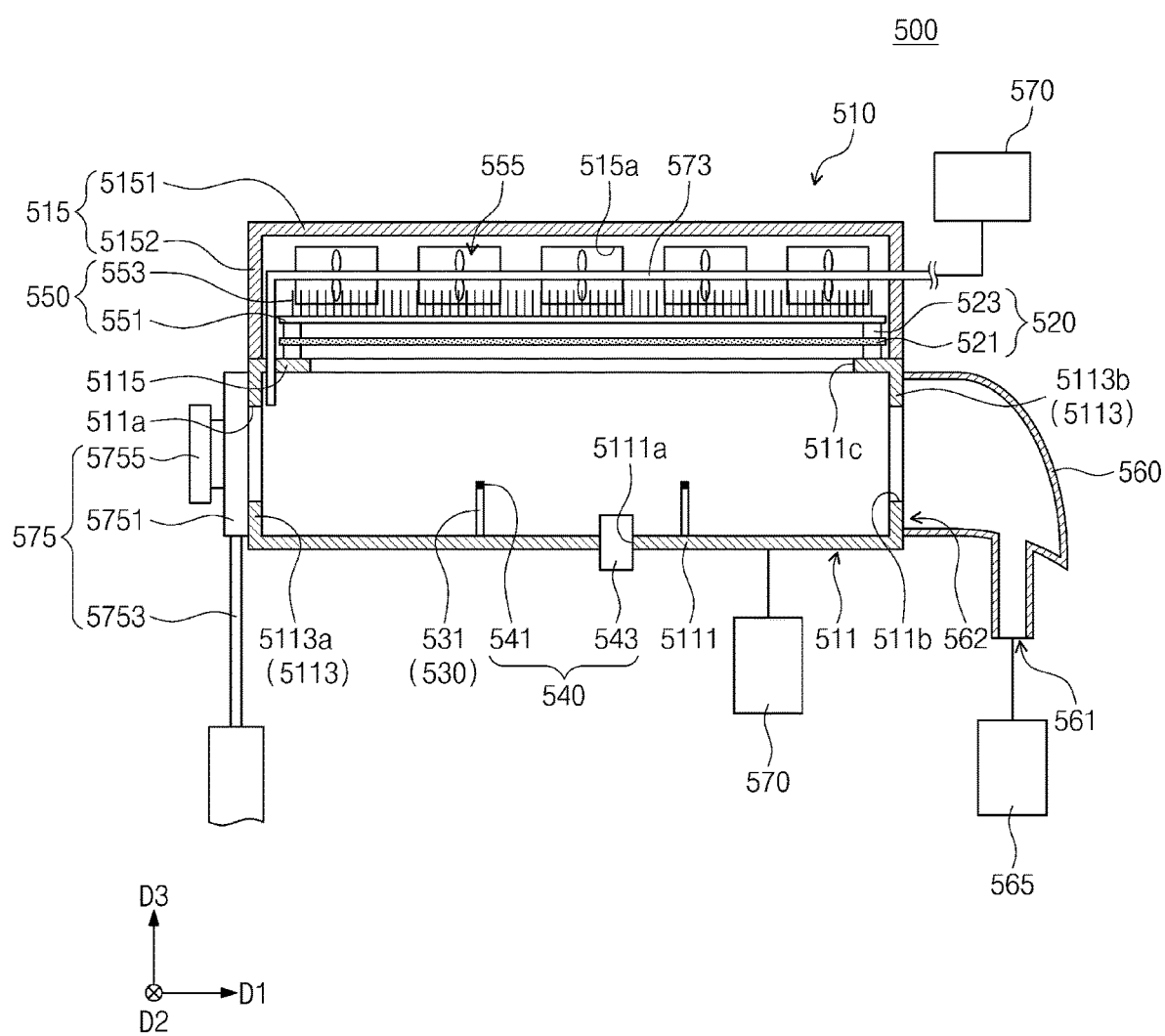
FIG. 11 is a schematic view illustrating other example of the residual gas removal apparatus of FIG. 3, according to an exemplary embodiment of the present inventive concept.

FIG. 11 is a schematic view illustrating other example of the residual gas removal apparatus shown in FIG. 3, according to an exemplary embodiment of the present inventive concept. The components substantially the same as those of the embodiments discussed with reference to FIGS. 3 to 5 are omitted or abbreviated for brevity of the description. Different from the residual gas removal apparatus 500 of FIG. 3, the housing 510 shown in FIG. 11 may not include the exhaust hole 511d, the gas flow path 511f, the supply hole 511e, and the supply port 514. Instead, the residual gas removal apparatus 500 of FIG. 11 may further include a gas line 573.

The gas line 573 may provide the housing 510 with a non-reactive gas supplied from the second gas supply 570. In this sense, the gas line 573 can be characterized as another embodiment of a gas supply channel. In an exemplary embodiment, the gas line 573 may have an end that is connected to the second gas supply 570 and an opposite end that is positioned close to the first opening 511a. The opposite end of the gas line 573 may be positioned in the third direction D3 from the first opening 511a, but the present inventive concept is not limited thereto. The opposite end of the gas line 573 may discharge the non-reactive gas supplied from the second gas supply 570.

The non-reactive gas (referred to hereinafter as an exhaust gas) discharged from the opposite end of the gas line 573 may flow toward the first opening 511a. In an exemplary embodiment, the exhaust gas may flow in a direction inverse to the third direction D3. The exhaust gas may thus prevent gas introduction through the first opening 511a from outside the housing 510.

The gas line 573 may be positioned within the housing 510. The gas line 573 may be positioned on or over the heat radiating member 550. The gas line 573 may be positioned adjacent to the heat radiating member 550. The gas line 573 may be provided with heat emitted from the heat radiating member 550. The gas line 573 may thus heat the non-reactive gas therein. The non-reactive gas may then have reduced humidity. it's the rate of defectives on the substrate then may be reduced due to the reduction in humidity of the non-reactive gas.

In an exemplary embodiment, a portion of the gas line 573 may be positioned between the heat radiating member 550 and the covering section 5151. Alternatively, in another exemplary embodiment, the gas line 573 may be positioned between the heat radiating member 550 and the ventilation unit 555.

It will be herein discussed an operation of the residual gas removal apparatus 500 constructed as stated above according to exemplary embodiments of the present inventive concept.

FIGS. 12 to 16 are schematic views illustrating a procedure where the residual gas removal apparatus of FIG. 2 is operated to remove a residual gas from a substrate, according to an exemplary embodiment of the present inventive concept. The components substantially the same as those discussed with reference to FIGS. 4 and 5 are omitted or abbreviated for brevity of the description.

Figure 12:
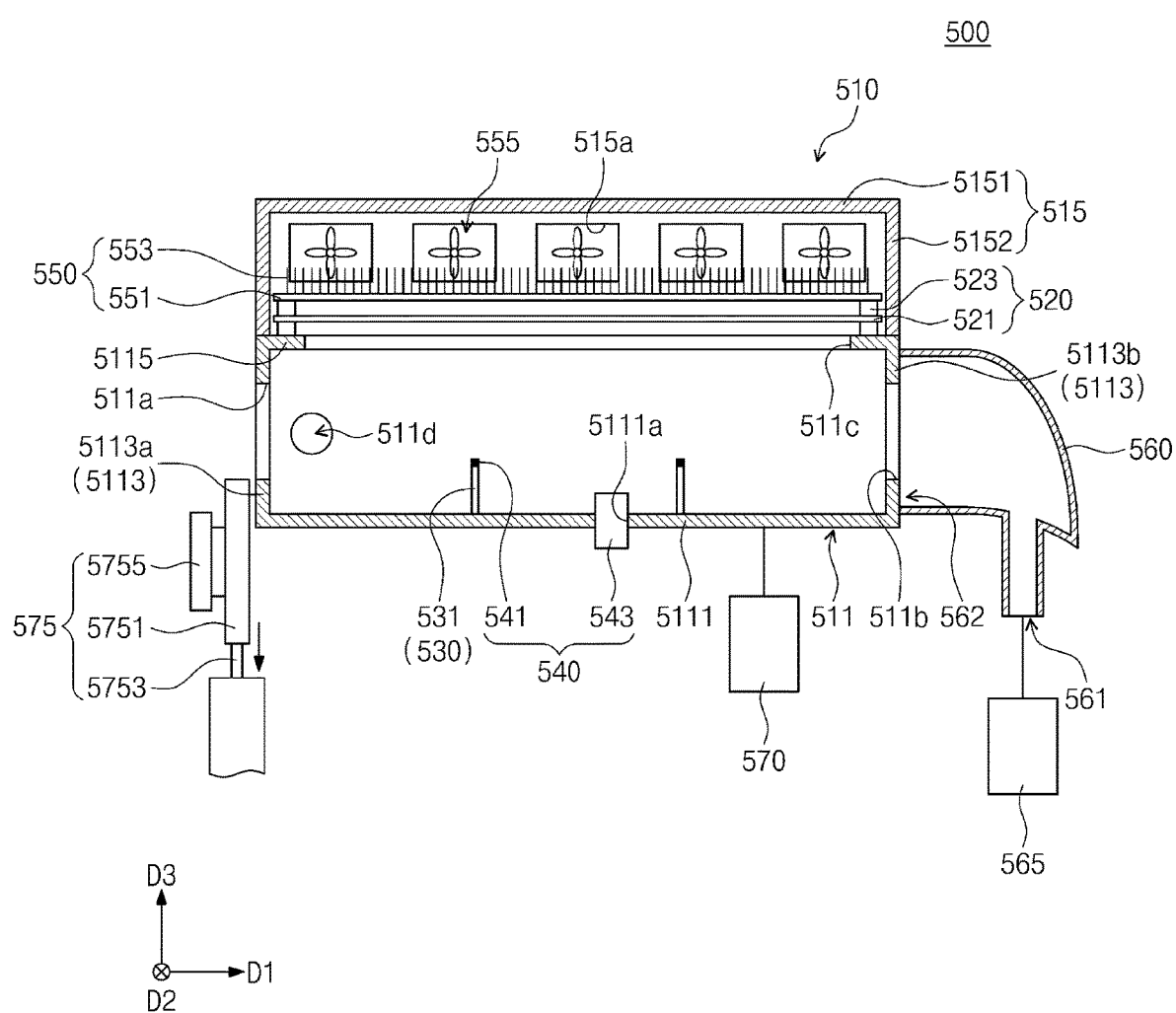
FIGS. 12 to 16 are schematic views illustrating a procedure where the residual gas removal apparatus of FIG. 3 is operated to remove a residual gas from a substrate according to an exemplary embodiment of the present inventive concept.

Referring to FIGS. 4 and 12, the controller 590 may control the opening/closing unit 575 to open the first opening 511a. For example, the controller 590 may control the second driving unit 5755 to move the shield plate 5751 in a direction inverse to the first direction D1. Accordingly, the shield plate 5751 may move away from the first sidewall 5113a. In addition, the controller 590 may control the first driving unit 5753 to move the shield plate 5751 in a direction inverse to the third direction D3. As a result, the first opening 511a may be changed from a closed state into an open state.

Figure 13:
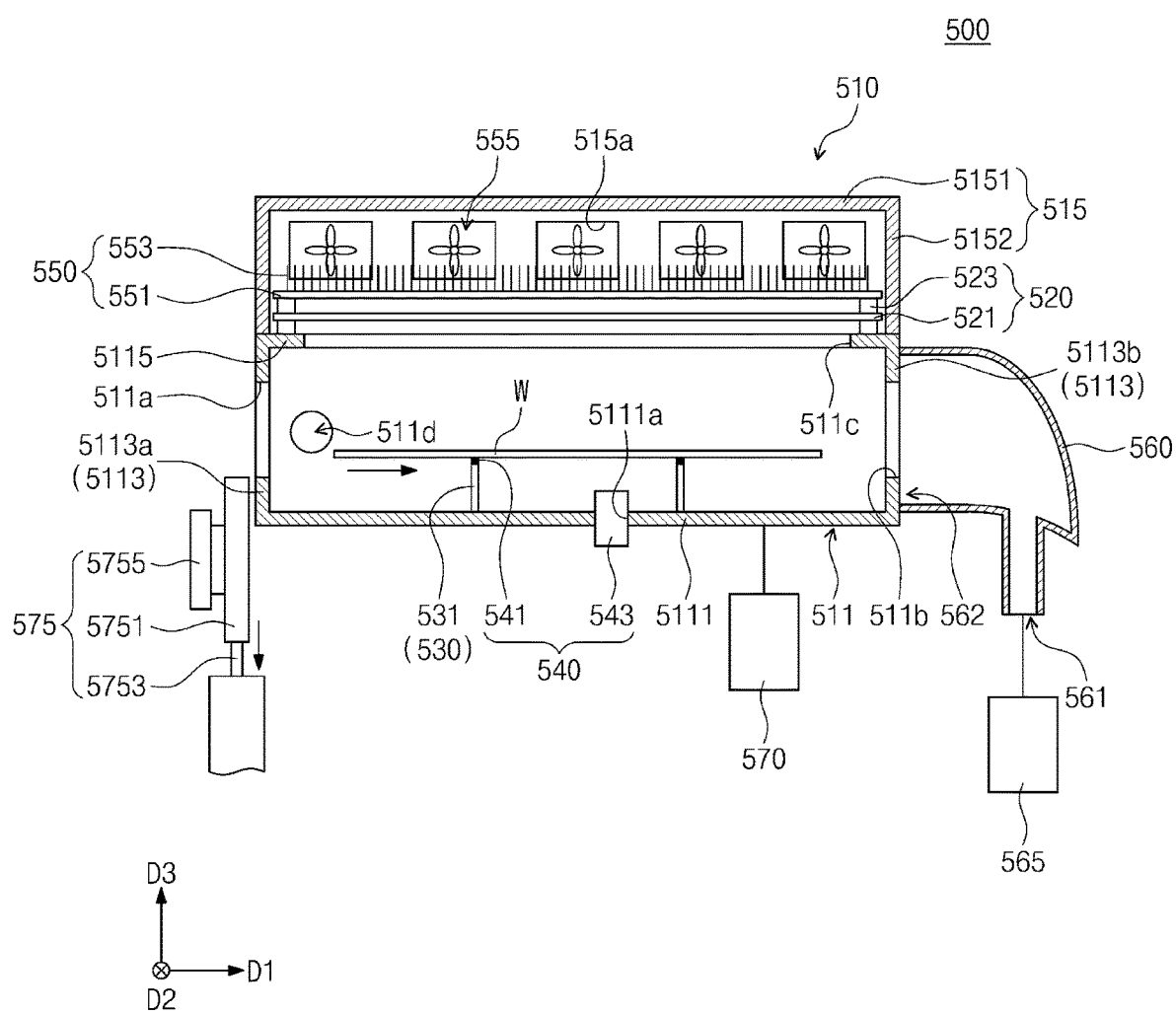

Referring to FIGS. 4 and 13, the housing 510 may receive in its inside the substrate W through the first opening 511a. For example, the second substrate transfer unit 450 may place the substrate W on the supporting member 530.

Figure 14:
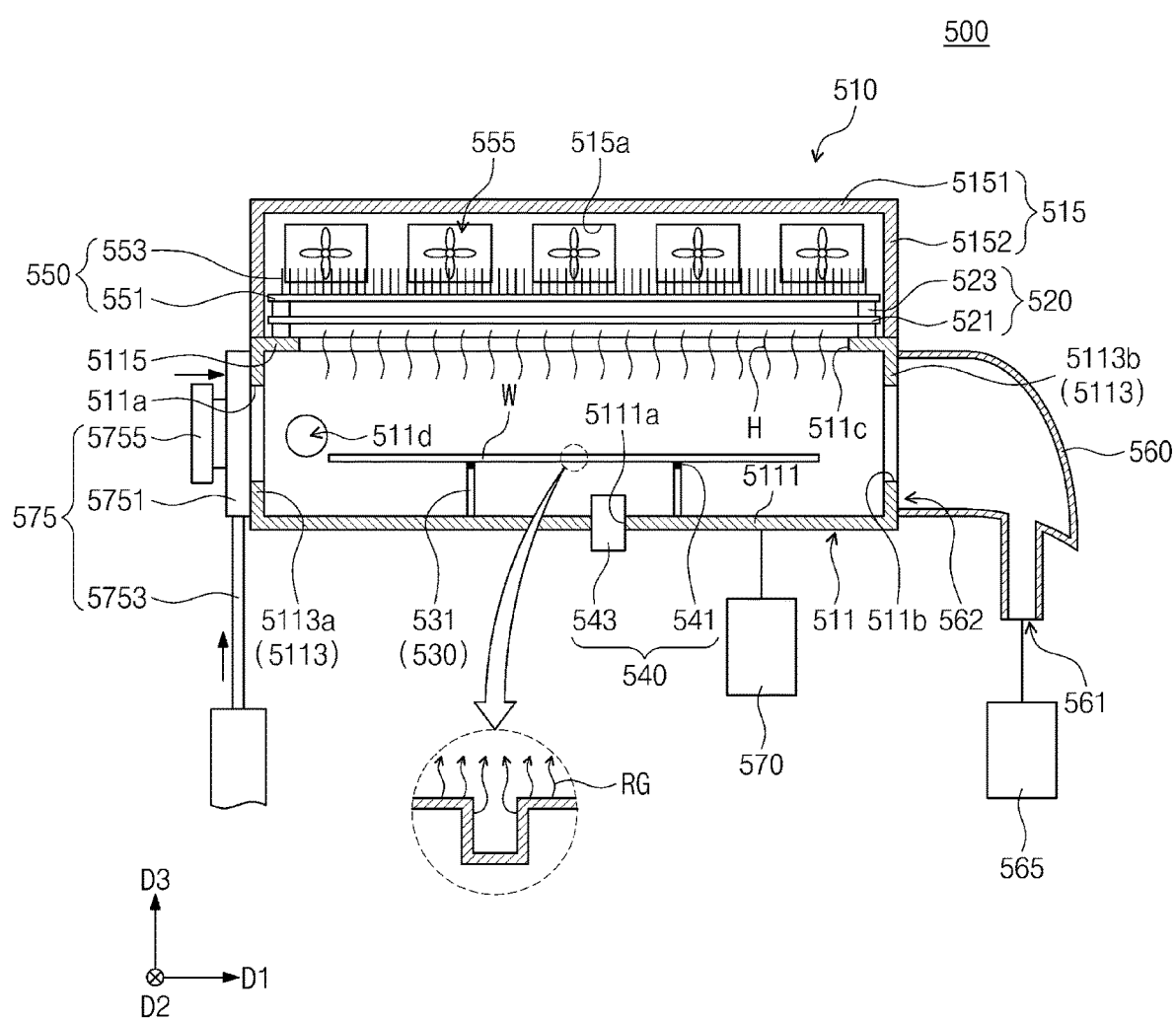

Referring to FIGS. 4 and 14, the controller 590 may control the opening/closing unit 575 to close the first opening 511a. For example, the controller 590 may control the first driving unit 5753 to move the shield plate 5751 in the third direction D3. In addition, the controller 590 may control the second driving unit 5755 to move the shield plate 5751 in the first direction D1. The shield plate 5751 may thus adhere to the first sidewall 5113a while completely covering the first opening 511a. That is, the first opening 511a may be closed.

The controller 590 may control the heating unit 520 to produce heat. As discussed above, the controller 590 may control the heating unit 520 by using temperature information I of the substrate W. The heat produced from the heating unit 520 may be provided to the substrate W on the supporting member 530. It thus may be possible to active a residual gas RG on a surface of the substrate W. The residual gas RG may be removed from the surface of the substrate W at a shorter time compared to when no heat is provided to the substrate W.

Figure 15:
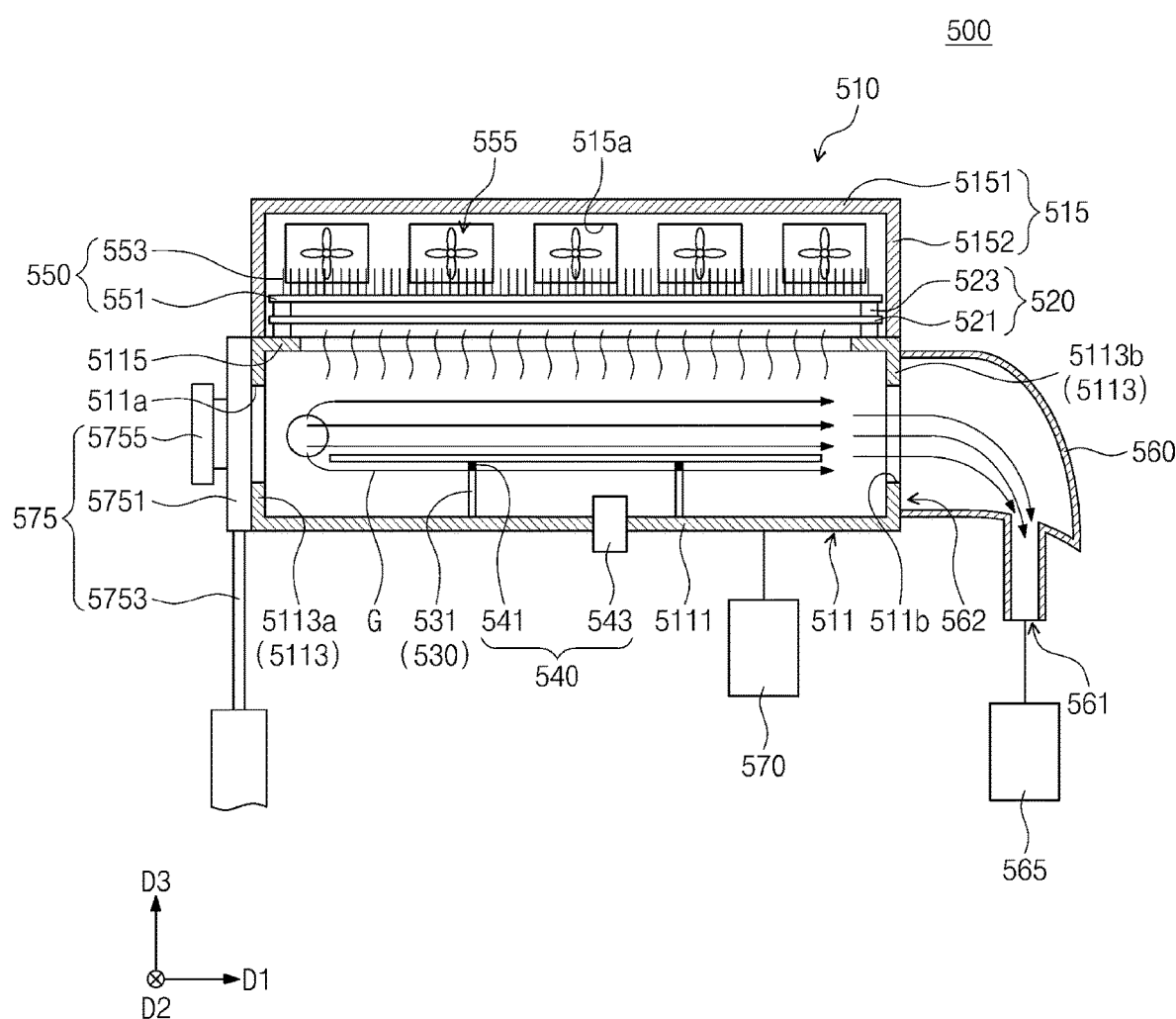

Referring to FIGS. 4 and 15, the controller 590 may control to operate the second gas supply 570 and the gas exhaust 565. The second gas supply 579 may provide the non-reactive gas G into the housing 510. For example, the non-reactive gas G may be provided through the exhaust hole 511d into the housing 510.

The gas exhaust 565 may receive a gas through the exhaust hole 561 from inside the housing 510. The non-reactive gas G may therefore flow toward the substrate W from the housing 510. The non-reactive gas G flowing toward the substrate W may purge the residual gas (see RG of FIG. 14). In this step, the non-reactive gas G does not react with the residual gas RG, thus no reactive particles are created. In addition, the non-reactive gas G does not oxidize a surface of the substrate W.

The residual gas RG and the non-reactive gas G may flow toward the exhaust hole 561 and may then be discharged outside the residual gas removal apparatus 500.

In an exemplary embodiment, the controller 590 may control the heating unit 520 to produce heat. Alternatively, in another exemplary embodiment, the controller 590 may control the heating unit 520 to stop its operation.

Figure 16:
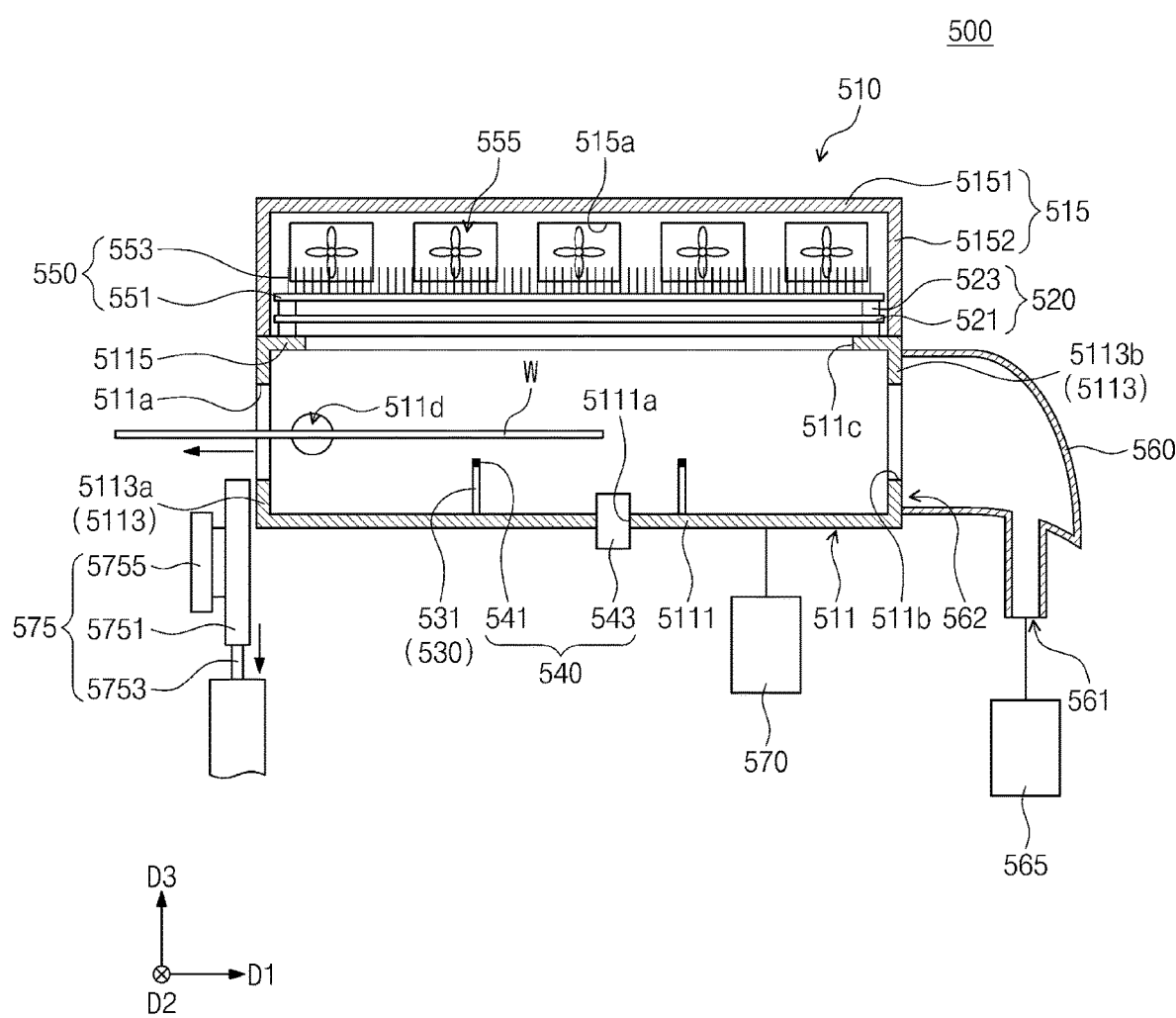

Referring to FIGS. 4 and 16, the controller 590 may control the opening/closing unit 575 to open the first opening 511a. The second substrate transfer unit 450 may unload the substrate W, from which the residual gas is removed, from the housing 510. Either or both of the FOUP F and the substrate reservoir 600 may accommodate the substrate W unloaded from the housing 510.

According to an exemplary embodiment of the present inventive concept, it may be possible to enhance removal efficiency of the residual gas on the substrate. As a result, the rate of defects caused by residual gas on a substrate may be reduced.

Furthermore, based on treatment capability of the residual gas removal apparatus, the residual gas may be quickly removed from the substrate. As a result, overall process time operating the substrate treating facility may be shortened and thus productivity may be enhanced.

Effects of the present inventive concept is not limited to the above-mentioned one, other effects which have not been mentioned above will be clearly understood to those skilled in the art from the following description.

While the present inventive concept has been shown and described with reference to exemplary embodiments illustrated in the accompanying drawings, it will be apparent to those of ordinary skill in the art that various changes in form and detail may be made therein without departing from the spirit and scope of the inventive concept as defined by the following claims. The above disclosed embodiments should thus be considered illustrative and not restrictive.

What is claimed is:

1. A removal apparatus for removing a residual gas, comprising:
 a housing;
 a gas supply configured to provide a non-reactive gas into the housing;
 a supporting member provided to support a substrate and positioned in the housing;
 a heat radiating member spaced apart from the supporting member and positioned in the housing; and
 a heating unit configured to provide heat toward the supporting member, wherein the heating unit is positioned between the heat radiating member and the supporting member;
 wherein the housing comprises:
 a floor section that supports the supporting member;
 a covering section that is spaced apart from and faces the floor section;
 a first circumferential section that extends toward the covering section from a boundary of the floor section; and
 a second circumferential section that extends toward the floor section from a boundary of the covering section,
 the first circumferential section comprising:
 a first sidewall having a first opening therethrough;
 a second sidewall having a second opening therethrough and facing the first sidewall;
 a third sidewall connecting a side of the first sidewall to a side of the second sidewall; and
 a fourth sidewall facing the third sidewall and connecting an opposite side of the first sidewall to an opposite side of the second sidewall.

2. The apparatus of claim 1, wherein the heating unit comprises at least one heating element,
 the heating element is one selected from the group consisting of a lamp radiating light and an electrical heater emitting heat.

3. The apparatus of claim 1, wherein each of the third and fourth sidewalls comprises:
 an inner surface having an exhaust hole adjacent to the first opening;
 an outer surface facing away from the inner surface and having a supply hole adjacent to the second opening, the supply hole being connected to the gas supply; and
 a gas flow path between the inner surface and the outer surface, the gas flow path connecting the exhaust hole to the supply hole.

4. The apparatus of claim 1, further comprising an opening/closing unit configured to open and close the first opening.

5. The apparatus of claim 1, further comprising a gas line having an end connected to the gas supply and an opposite end positioned adjacent to the first opening,
 wherein a portion of the gas line is placed on the heat radiating member in the housing.

6. The apparatus of claim 1, further comprising at least one ventilation unit in the housing, the ventilation unit being positioned adjacent to the heat radiating member, wherein the housing comprises at least one heat radiating hole configured to discharge a gas flowed by the ventilation unit.

7. The apparatus of claim 1, further comprising:
 a temperature gauge provided to measure a temperature of the substrate; and
 a controller configured to control the heating unit based on the temperature measured by the temperature gauge.

8. The apparatus of claim 7, wherein the temperature gauge comprises at least one selected from the group consisting of a first temperature gauge unit and a second temperature gauge unit,
 wherein the first temperature gauge unit is provided on the supporting member so as to be contactable with a substrate supported by the supporting member, and the second temperature gauge unit is provided on the housing so as not to be contactable with a substrate supported by the supporting member.

9. The apparatus of claim 1, further comprising an elevation unit configured to move the supporting member toward the heating unit.

10. The apparatus of claim 1, wherein the non-reactive gas is at least one selected from the group consisting of nitrogen ($N_2$) gas and a noble gas including argon (Ar) gas and helium (He) gas.

11. A substrate treating facility, comprising:
 at least one process treating module;
 a load lock chamber spaced apart from the process treating module;
 a transfer chamber connecting the process treating module to a side of the load lock chamber;
 a substrate transfer module connected to an opposite side of the load lock chamber; and at least one residual gas removal apparatus connected to the substrate transfer module,
 wherein the substrate transfer module comprises a substrate transfer unit configured to transfer a substrate between the load lock chamber and the residual gas removal apparatus, and
 wherein the residual gas removal apparatus comprises:
 a housing;
 a gas supply configured to provide a non-reactive gas into the housing;
 a supporting member provided to support the substrate and positioned in the housing;
 a heat radiating member spaced apart from the supporting member and positioned in the housing; and
 a heating unit configured to provide heat toward the supporting member, wherein the heating unit is positioned between the heat radiating member and the supporting member;
 wherein the housing comprises:
 a floor section that supports the supporting member;
 a covering section that is spaced apart from and faces the floor section;
 a first circumferential section that extends toward the covering section from a boundary of the floor section; and
 a second circumferential section that extends toward the floor section from a boundary of the covering section,
 the first circumferential section comprising:
 a first sidewall having a first opening therethrough;
 a second sidewall having a second opening therethrough and facing the first sidewall;
 a third sidewall connecting a side of the first sidewall to a side of the second sidewall; and
 a fourth sidewall facing the third sidewall and connecting an opposite side of the first sidewall to an opposite side of the second sidewall.

12. The facility of claim 11, wherein each of the third and fourth sidewalls comprises:
- an inner surface having an exhaust hole adjacent to the first opening;
- an outer surface facing the inner surface and having a supply hole connected to the gas supply, the supply hole being positioned adjacent to the second opening; and
- a gas flow path between the inner surface and the outer surfaces, the gas flow path connecting the exhaust hole and the supply hole to each other.

13. The facility of claim 11, further comprising:
- a temperature gauge provided to measure a temperature of the substrate; and
- a controller configured to control the heating unit based on the temperature measured by the temperature gauge.

\* \* \* \* \*